(12) United States Patent
Ide et al.

(10) Patent No.: US 8,746,932 B2
(45) Date of Patent: Jun. 10, 2014

(54) LIGHT EMITTING DEVICE AND METHOD FOR MANUFACTURING THE SAME

(75) Inventors: Shunya Ide, Tokyo (JP); Masanori Sato, Tokyo (JP); Takahiko Nozaki, Tokyo (JP); Takaaki Sakai, Tokyo (JP); Hiroshi Kotani, Tokyo (JP)

(73) Assignee: Stanley Electric Co., Ltd., Tokyo (JP)

( * ) Notice: Subject to any disclaimer, the term of this patent is extended or adjusted under 35 U.S.C. 154(b) by 590 days.

(21) Appl. No.: 12/948,521

(22) Filed: Nov. 17, 2010

(65) Prior Publication Data

US 2011/0116271 A1    May 19, 2011

(30) Foreign Application Priority Data

Nov. 17, 2009 (JP) ................................. 2009-262209
Sep. 22, 2010 (JP) ................................. 2010-212382

(51) Int. Cl.
*F21V 7/00* (2006.01)
(52) U.S. Cl.
USPC . 362/297; 362/294; 362/296.04; 362/311.02; 257/79; 257/81; 257/98; 257/99; 257/100; 313/498; 313/499; 29/530; 438/112; 438/113; 438/124

(58) Field of Classification Search
USPC ............ 257/99, 89, 81, 79, 98, 100; 362/294, 362/297, 296.04, 311.02; 29/530; 313/498, 313/499; 438/112, 113, 124
See application file for complete search history.

(56) References Cited

U.S. PATENT DOCUMENTS

| | | | |
|---|---|---|---|
| 6,365,922 B1 | 4/2002 | Chang | |
| 6,603,148 B1 * | 8/2003 | Sano et al. | 257/98 |
| 6,822,269 B2 * | 11/2004 | Horiuchi et al. | 257/99 |
| 6,995,510 B2 * | 2/2006 | Murakami et al. | 313/512 |
| 7,183,588 B2 * | 2/2007 | Chia et al. | 257/99 |
| 7,208,772 B2 * | 4/2007 | Lee et al. | 257/99 |
| 7,268,014 B2 * | 9/2007 | Lee et al. | 438/106 |
| 7,317,181 B2 * | 1/2008 | Murakami et al. | 250/214.1 |

(Continued)

FOREIGN PATENT DOCUMENTS

| EP | 1 408 559 A2 | 4/2004 |
|---|---|---|
| JP | 2002-314148 A | 10/2002 |

(Continued)

OTHER PUBLICATIONS

The extended European Search Report for the related European Patent Application No. 10014696.8 dated Mar. 3, 2014.

*Primary Examiner* — Thomas A Hollweg
(74) *Attorney, Agent, or Firm* — Kenealy Vaidya LLP

(57) ABSTRACT

In the production of a light emitting device, in which a plurality of light emitting element parts carrying LED elements are formed on a substrate, and the substrate is diced, generation of shaving dusts is suppressed at the time of the dicing, and breakage of the substrate during the production process can be prevented. In the process of forming a slit crossing a region for forming a light emitting element part in a metal substrate, a recess which serves as a resin reservoir can be formed so as to cross the slit. The slit can be filled with an insulating material, the recess can be filled with a resin, and they both can be cured. A light emitting element part can be formed in the region for forming the light emitting element part, the metal substrate can be cut into units comprising one or a plurality of the light emitting element parts, and can be mounted on a printed circuit board on which a pattern is formed.

9 Claims, 24 Drawing Sheets

(56) References Cited

U.S. PATENT DOCUMENTS

| | | | |
|---|---|---|---|
| 7,566,912 B2* | 7/2009 | Lee et al. | 257/98 |
| 2001/0022390 A1 | 9/2001 | Waitl et al. | |
| 2002/0163001 A1* | 11/2002 | Shaddock | 257/79 |
| 2003/0098459 A1* | 5/2003 | Horiuchi et al. | 257/81 |
| 2004/0232435 A1* | 11/2004 | Hofer et al. | 257/99 |
| 2005/0151149 A1* | 7/2005 | Chia et al. | 257/99 |
| 2005/0280017 A1* | 12/2005 | Oshio et al. | 257/99 |
| 2006/0043401 A1* | 3/2006 | Lee et al. | 257/99 |
| 2006/0054912 A1* | 3/2006 | Murakami et al. | 257/99 |
| 2006/0071318 A1 | 4/2006 | Yamamura | |
| 2006/0246617 A1* | 11/2006 | Lee et al. | 438/26 |
| 2007/0221928 A1* | 9/2007 | Lee et al. | 257/79 |
| 2008/0224161 A1 | 9/2008 | Takada | |
| 2008/0296592 A1* | 12/2008 | Osamu | 257/89 |
| 2010/0187546 A1* | 7/2010 | Fushimi et al. | 257/88 |
| 2010/0270571 A1* | 10/2010 | Seo | 257/98 |

FOREIGN PATENT DOCUMENTS

| | | |
|---|---|---|
| JP | 3447604 B2 | 9/2003 |
| JP | 2006-108341 A | 4/2006 |
| JP | 2006-245626 A | 9/2006 |

* cited by examiner

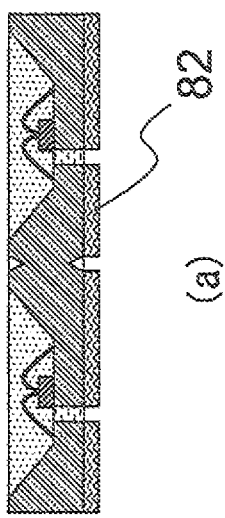
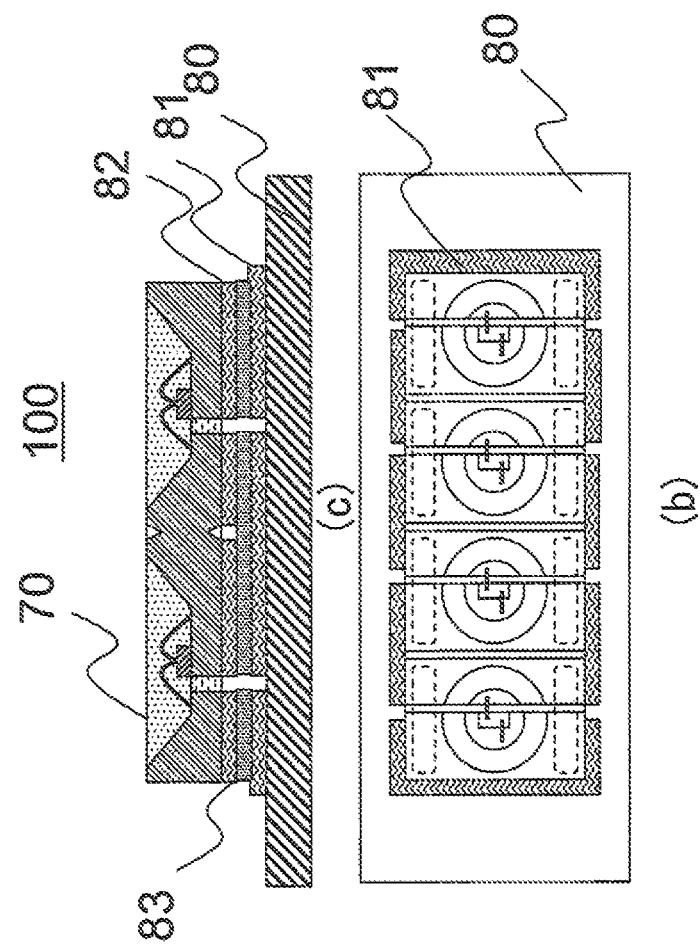
Fig. 8

(a)

(b)

LIGHT EMITTING DEVICE AND METHOD FOR MANUFACTURING THE SAME

This application claims the priority benefit under 35 U.S.C. §119 of Japanese Patent Application No. 2009-262209 filed on Nov. 17, 2009 and No. 2010-212382 filed on Sep. 22, 2010, which are hereby incorporated in their entirety by reference.

TECHNICAL FIELD

The present invention relates to a light emitting device carrying LED elements on a metal substrate and a method for manufacturing the same, in particular, a technique aiming at improvement in strength of the light emitting device during the production process thereof.

BACKGROUND ART

In a typical method for producing light emitting devices such as LED light sources, a plurality of LED elements are fixed on one substrate by die bonding or the like, and then the substrate is diced for every one or two or more LED elements and mounted on a printed circuit board (for example, Patent document 1). In such a production process, reflectors for enhancing luminous efficiency of the LED elements are provided around the LED elements.

Patent document 2 discloses a technique of forming a layer of a light reflecting resin serving as a reflector before the LED elements are separated by dicing, and then performing the dicing. Moreover, various techniques of using a thin metal plate as a substrate for carrying LED elements and utilizing the metal plate as a reflector are also proposed (Patent documents 3 and 4). When a metal plate is used as a substrate of LED elements, it is essential to provide a slit for insulating a part for connecting one electrode of an LED element (die bonding pad) and a part for connecting the other electrode (wire bonding pad). In this case, it is necessary to connect the metal plates separated by the slit during the production.

In the technique described in Patent document 3, a thin metal plate is first subjected to a press processing to form a reflector, a die bonding pad and a wire bonding pad are separated with a slit, and an insulating resin such as an epoxy resin in which silica or the like is dispersed is flown over the back face of the thin metal plate. Destruction of the connection is thereby prevented at the time of separation of LED elements formed on the metal substrate by dicing.

In the technique described in Patent document 4, both ends of a thin metal plate are bent to have a section of a right-angled U-shape to secure strength, and the portions on both sides of the slit are connected with an insulating masking tape.
[Prior Art References]
[Patent Documents]
Patent document 1: Japanese Patent Unexamined Publication (KOKAI) No. 2006-108341
Patent document 2: Japanese Patent Unexamined Publication No. 2006-245626
Patent document 3: Japanese Patent No. 3447604
Patent document 4: Japanese Patent Unexamined Publication No. 2002-314148

SUMMARY OF THE INVENTION

Object to be Achieved by the Invention

In the technique described in Patent document 2, the LED package substrate on which the reflector is formed with a resin is divided by dicing, and this poses a problem that shaving dusts of the reflector (resin) are generated by dicing. That is, if the dicing is performed before a sealing resin is injected inside the reflector, the generated shaving dusts may enter into the reflector to invite decrease in adhesion strength of the sealing resin, or dusts may adhere to the LED elements to invite decrease in luminous flux or abnormal luminous strength distribution. Even when the dicing is performed after the sealing resin is injected into the reflector, generated shaving dusts may adhere to light emitting surfaces of LEDs to invite decrease in luminous flux or abnormal luminous strength distribution.

On the other hand, when the reflector is produced with the thin metal plate itself, which serves as the substrate, the problem induced by shaving dusts is eliminated, but insufficient connection strength at the slit provided between the metal plates poses a problem. In the technique described in Patent document 3, this problem is solved by flowing the resin over the back face of the metal plate. However, heat conductivity of resin is generally markedly lower compared with metal, and therefore, even if a material showing a comparatively good heat radiation property is used as the resin, heat radiation property is inevitably degraded. In particular, when electric current consumption is increased in accordance with demand of higher brightness of light emitting devices, insufficiency of the heat radiation property is concerned.

The technique described in Patent document 4 is not supposing the dicing. However, the portions of the thin metal plate separated by the slit are connected with a masking tape and a resin laminated on the thin metal plate, and if dicing is used, the problem of the generation of shaving dusts occurs as in the case of the technique of Patent document 2. Moreover, if the dicing is performed before the resin layer is provided, strength of the connection part cannot be maintained only with the masking tape.

An object of the present invention is to provide a method for manufacturing a light emitting device in which dusts are not substantially generated at the time of dicing, strength of the substrate, especially strength of the substrate at the slit, is enhanced, and such a problem as destruction of the connection part is not caused in the production process including dicing.

Means for Achieving the Object

The method for manufacturing a light emitting device of the present invention, which achieves the aforementioned object, comprises the step of forming a slit in a metal substrate across a region for forming light emitting element part and filing the slit with an insulating material, and is characterized in that, in that step, a recess for serving as resin reservoir is formed across the slit, and this recess is filled with a resin.

One embodiment of the method for manufacturing a light emitting device of the present invention is constituted as follows:

A method for manufacturing a light emitting device comprising the step (1) of forming a slit crossing a region for forming light emitting element part in a metal substrate, the step (2) of filling the slit with an insulating material, the step (3) of forming a light emitting element part in the region for forming light emitting element part, and the step (4) of cutting the metal substrate on which the light emitting element part is formed into units each comprising one or more of the light emitting element parts, wherein a recess for serving as resin reservoir is formed across the slit in a region of the metal substrate other than the region immediately under the region for forming light emitting element part in the step (1), and the recess is filled with a resin in the step (2).

In this method for manufacturing a light emitting device, the step (1) preferably comprises the step of forming a reflector part in the region for forming light emitting element part of the metal substrate.

Another embodiment of the method for manufacturing a light emitting device of the present invention is constituted as follows:

A method for manufacturing a light emitting device comprising the step (1) of forming a region for forming light emitting element part and a slit crossing the region for forming light emitting element part in a metal substrate, the step (2) of forming a light emitting element part in the region for forming light emitting element part, the step (3) of filling the slit with an insulating material, and the step (4) of cutting the metal substrate on which the light emitting element part is formed into units each comprising one or more of the light emitting element parts, wherein the region for forming light emitting element part formed in the step (1) has a recess for serving as reflector and a convex portion protruding from the bottom surface of the recess for serving as reflector, a recess for serving as resin reservoir is formed across the slit in a region of the metal substrate other than the region immediately under the region for forming light emitting element part with respect to the substrate thickness direction in the step (1), and a bottom portion of the recess for serving as reflector except for the convex portion, and the recess for serving as resin reservoir are filled with a resin in the step (3).

In the method for manufacturing a light emitting device of the present invention, the resin filled in the recess for serving as resin reservoir is preferably the same material as the insulating material filled in the slit.

In the method for manufacturing a light emitting device of the present invention, if the face on which the region for forming light emitting element part exists is defined as the surface, the recess for serving as resin reservoir may be formed on the surface side of the metal substrate, or may be formed on the back face side. Alternatively, the recess may be formed on both the surface and the back face. The recess for serving as resin reservoir formed on the surface and/or the back face may perforate the metal substrate through a through-hole.

In another embodiment of the method for manufacturing a light emitting device of the present invention, a plurality of the reflector parts are formed in the step (1), and a part of the reflector parts also serve as the recess for serving as resin reservoir. In this case, shapes of the reflector parts may be the same or different. For example, a plurality of kinds of reflector parts having different shapes are formed in the step (1), the light emitting element parts are formed in the reflector parts of the same kind of shape, and the other reflector parts are used as the recesses for serving as resin reservoir.

The light emitting device of the present invention comprises a metal substrate having a reflector part and a slit crossing the reflector part and filled with an insulating material, and a light emitting element connected to the reflector part of the metal substrate, and is characterized by having a recess filled with a resin and crossing the slit in a region of the metal substrate other than the region immediately under the region where the reflector part is formed with respect to the substrate thickness direction.

In another embodiment, the light emitting device of the present invention comprises a metal substrate having a reflector part and a slit crossing the reflector part and filled with an insulating material, and a light emitting element connected to the reflector part of the metal substrate, and is characterized in that the reflector part has a convex portion for carrying light emitting element protruding from the bottom surface of the reflector part, the metal substrate has a recess formed across the slit in a region of the metal substrate other than the region immediately under the region where the reflector part is formed with respect to the substrate thickness direction, and the recess and the bottom portion of the reflector part except for the convex portion for carrying light emitting element are filled with a white resin.

In the present invention, the "resin" which is filled in the recess means a resin of a broad sense including a resin composition.

Effect of the Invention

According to the present invention, when a light emitting device is produced by forming a plurality of light emitting element parts on a metal substrate and dividing the substrate into units each comprising one or more light emitting element parts, slits are provided in the parts of the metal substrate for providing the light emitting element parts, recesses crossing the slits are provided, and the slits and the recesses are filled with a resin or the like. Thereby, the portions of the metal substrate separated by the slits on both sides of the slits are firmly adhered with the resin, and therefore strength of connection portions at the slits of the metal substrate can be enhanced. Destruction of the connection parts of the metal substrate can be thereby prevented during the production process, and yield of the products can be thereby improved.

Moreover, since the recesses are formed in regions other than the regions immediately under the light emitting elements, heat radiation from the metal substrate is not inhibited, and superior heat radiation property is maintained. Moreover, at the time of separating the light emitting element parts by dicing or the like, generation of shaving dusts from the resin can be eliminated, and thus inhibition of the characteristics of the light emitting device by shaving dusts can be prevented.

BRIEF DESCRIPTION OF THE DRAWINGS

[FIG. 8] Drawings for explaining the step of mounting the light emitting devices on a printed circuit board: (a) sectional view showing the state after metal plating processing, (b) and (c): top view and sectional view showing the light emitting devices mounted on a printed circuit board

MODES FOR CARRYING OUT THE INVENTION

Figure 1:
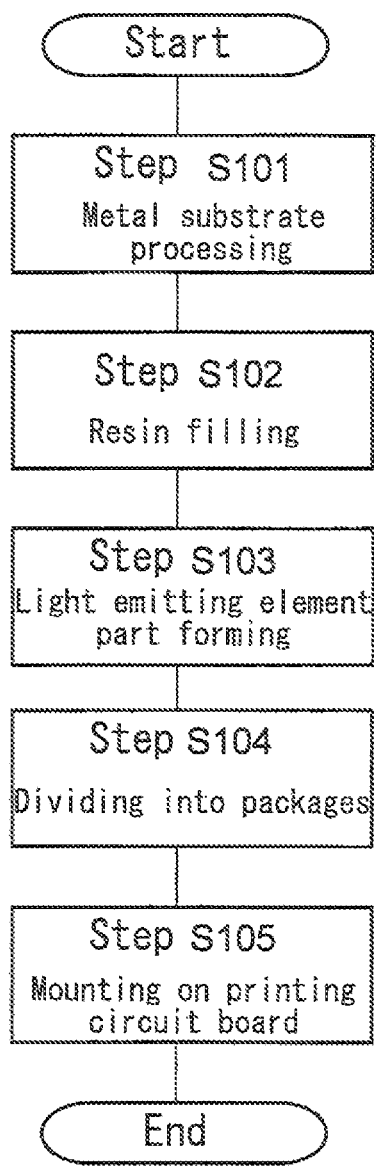
[FIG. 1] A flowchart showing an example of the production process of the light emitting device of the present invention

Hereafter, embodiments of the method for manufacturing a light emitting device of the present invention will be explained with reference to the drawings.
<First Embodiment>
FIG. 1 is a drawing showing the procedure of the method for manufacturing a light emitting device according the first embodiment, and FIGS. 2 to 8 include drawings showing the light emitting devices (including parts thereof in the middle of the production) in various steps of the production method.

As shown in FIG. 1, the production method of this embodiment mainly consists of a metal substrate processing step (S101) in which a plurality of reflector parts and slits are formed in a metal substrate, a resin filling step (S102) in which the slits are filled with an insulating resin, a light emitting element part forming step (S103) in which light emitting element parts are formed in respective reflector parts, a dividing step (S104) in which the metal substrate on which the light emitting element parts are formed is divided into units each comprising one or a plurality of light emitting element parts, and a mounting step (S105) in which the divided light emitting element parts are mounted on a printed circuit board, and is characterized in that the method comprises the step of forming recesses so that the recesses should cross the slits in the metal substrate processing step (S101), and the step of filling the recesses with a resin in the resin filling step (S102).

The metal substrate is a tabular member consisting of a metal, and a metal substrate consisting of a material showing high heat conductivity and reflectance, and easy to process is preferred. For example, a Cu plate material applied with a Ni plating layer and further applied with an Ag plating layer or Au plating layer thereon, an Al plate material, and so forth can be preferably used. Thickness of the metal substrate is determined in view of workability or heat radiation property. For example, it is determined to be about 0.5 to 1.0 mm.

Figure 2:
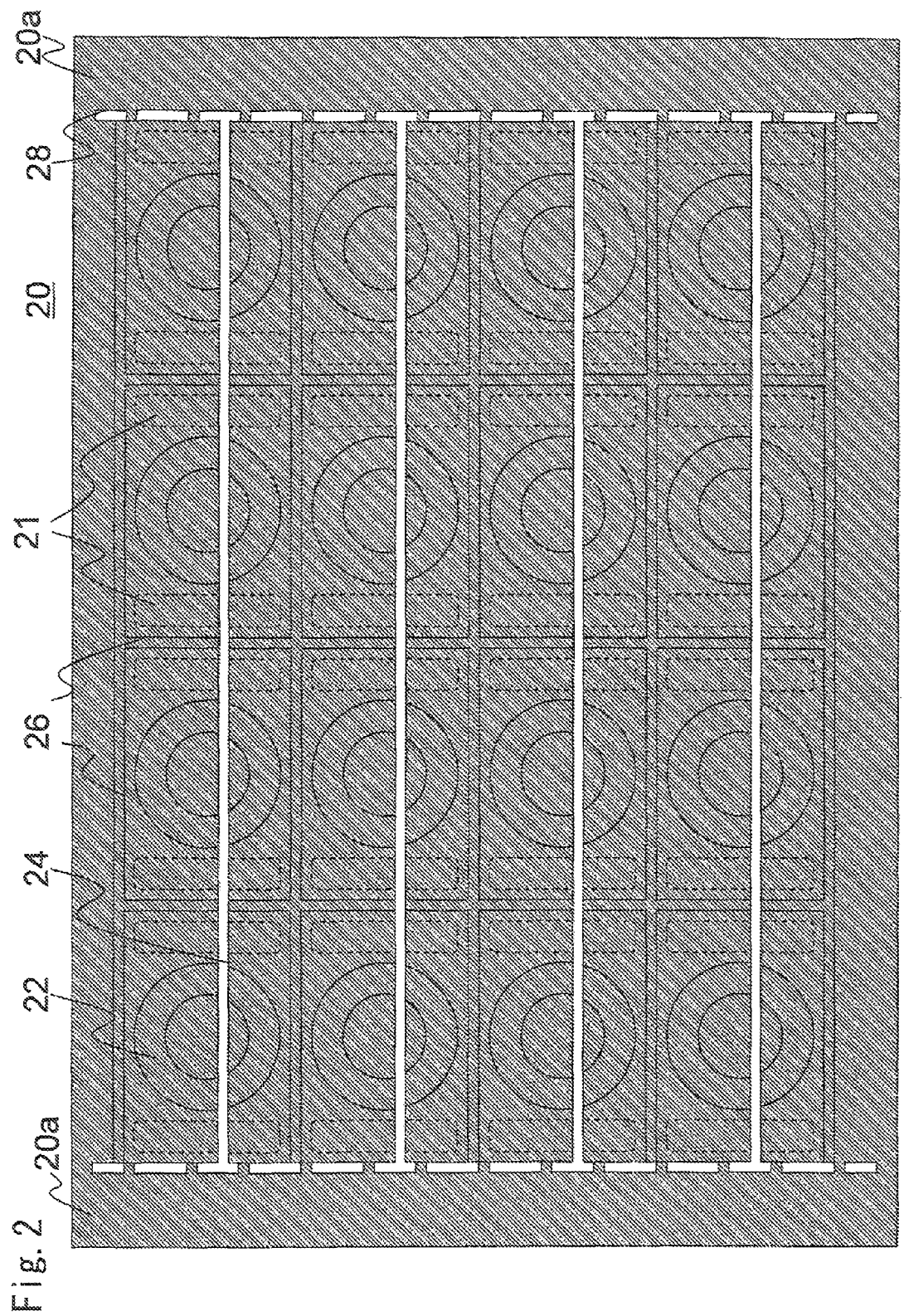
[FIG. 2] A top view of a metal substrate subjected to the metal plate processing according to the first embodiment
Figure 3:
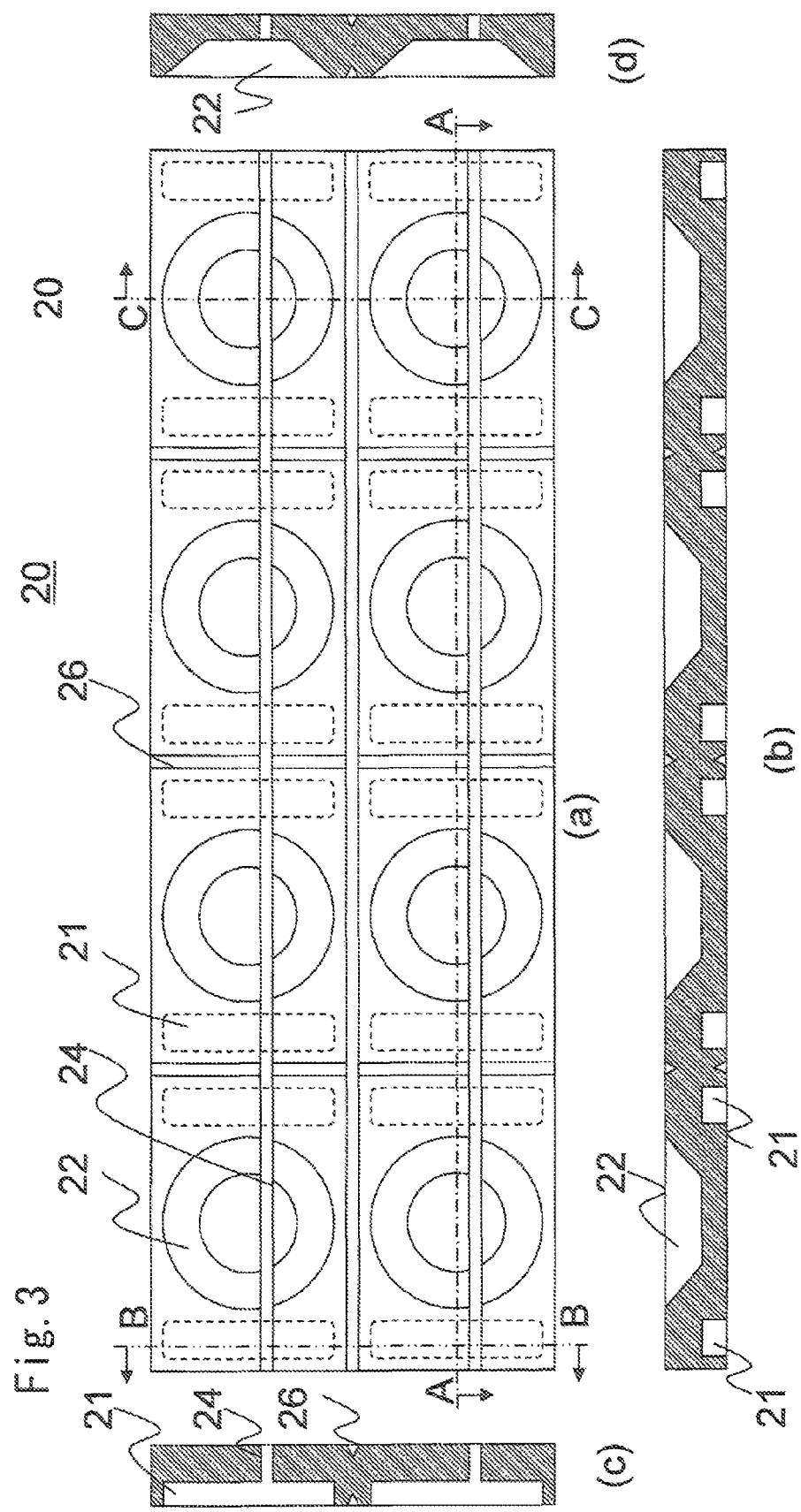
[FIG. 3] Drawings showing a metal substrate subjected to the metal processing of the production method according to the first embodiment: (a) top view, (b) sectional view along A-A in (a), (c) sectional view along B-B in (a), and (d) sectional view along C-C in (a)

In the metal substrate processing step (S101), on one surface of such a metal substrate, a plurality of reflector parts are formed, and slits crossing these reflector parts are formed. One embodiment of the metal substrate 20 in which the reflector parts 22 and slits 24 have been formed in the step (S101) is shown in FIGS. 2 and 3. FIG. 3 includes drawings showing a part of the metal substrate shown in FIG. 2, in which (a) is a top view, (b) is a sectional view along the line A-A in the top view, (c) is a sectional view along the line B-B in the same, and (d) is a sectional view along the line C-C in the same. As shown in FIGS. 3, (b) and (d), the reflector parts 22 each consist of a recess in the form of a reversed truncated cone, on the bottom surface of which the LED element described later is fixed by die bonding, and functions as a reflector for reflecting light emitted from the LED element. A plurality of the reflector parts 22 are formed on the rectangular surface of the metal substrate along perpendicularly intersecting two directions at predetermined intervals. In the example shown in the drawings, reflector parts are formed in four rows wide and four rows long, but the number of the reflector parts (numbers of rows) is not limited to this example.

Depth of the reflector part 22 is determined to be larger than the thickness of the LED element, so that when the reflector part 22 is filled with a resin or the like, wires used for electric connection of the LED element should not protrude out of the upper part. Specifically, when the thickness of the metal substrate 20 is about 1 mm, the depth is determined to be 0.4 mm or larger, for example.

Moreover, in order to make division of the reflector parts 22 easy, a plurality of grooves 26 having a V-shaped section (V-grooves) are formed along the arrangement directions of the reflector parts 22. In the embodiment shown in the drawings, V-grooves 26 are formed on both the up and down side surfaces of the metal substrate 20, but they may be formed on only one surface. Thickness of the V-grooves 26 is preferably 0.15 mm or smaller in view of strength. Instead of the V-grooves 26, perforations may also be used.

The slit 24 is for electrically insulating a part of the metal substrate 20 to which one of two electrodes of an LED element to be bonded to the reflector part 22 is connected and a part of the metal substrate 20 to which the other electrode is connected. Therefore, the slit 24 is formed so that it should cross the row of the reflector parts 22, and penetrate the metal substrate 20. Although width of the slit is not particularly limited, it is usually comparable to the thickness of the substrate.

In order to maintain the metal substrates 20 divided by the slit 24 to be one body until the final cutting step, the slit 24 does not reach the end of the metal substrate 20, and peripheral parts 20a in which the slit 24 is not formed are formed at the ends of the metal substrate 20, as shown in FIG. 2. In order to finally separate these peripheral part 20a, perforation slits 28 are formed at the both ends of the slit 24.

Further, on the face (back face) of the metal substrate 20 opposite to the surface on which the reflector parts 22 are formed, recesses 21 for serving as resin reservoir are formed in the regions between two adjacent reflector parts 22 so as to cross the slits 24. The recesses 21 as well as the slits 24 are filled with a resin in the next step (S102) to enhance adhesion strength of the resin filled in the slit 24 and the metal substrate, i.e., the adhesion strength of the connection part of the metal substrate. Although the adjacent parts of the metal substrate 20 divided by the slit 24 are maintained in a bonded state by filling the slit 24 with a resin, the adhesion strength between them is weak. The adhesion strength is weak especially to a stress along the direction perpendicular to the slit 24, and the metal substrate 20 is easily broken at the slit 24 in the course of the production. By providing the recess 21 which functions as resin reservoir so that it should cross the slit 24, adhesion strength with the metal substrate is enhanced, and destruction in the course of the production is prevented.

It is important to choose the position at which the recess 21 is provided in a region other than the region immediately under the region of the metal substrate where the LED element is fixed, i.e., back face portion corresponding to the portion where the reflector part 22 is provided, in order to make the metal substrate 20 efficiently radiate the heat emitted by the LED element. In the embodiment shown in the drawings, two elongated recesses 21 are formed on the both sides of each reflector part 22 on the back face. When V-grooves 26 along the direction perpendicular to the slit 24 (vertical V-grooves in the drawings) are not formed, that is, in the case of a light emitting device designed to be produced by separating a horizontal row consisting of a plurality of reflector parts as an unit, two recesses 21 formed on both sides of V-grooves 26 can be replaced with one recess.

Moreover, the recess 21 is preferably provided in a region other than the portions to be cut in the dividing step (S104) (V-grooves). Generation of shaving dusts from the resin filled in the recesses 21 can be thereby prevented at the time of cutting.

Depth of the recess 21 is preferably 0.1 mm or larger in order to enhance the adhesion strength. Moreover, in order not to inhibit the heat radiation action of the metal substrate 20, the depth is preferably about a half of the thickness of the metal substrate 20. In particular, in order not to inhibit radiation of heat conducted along the transverse direction from the LED element, the depth is preferably such a depth that the recess should not reach the level of the bottom surface of the reflector part 22. That is, if the thickness of the metal substrate is represented by d (mm), and the depth of the reflector part is represented by d1, depth d2 of the recess 21 is preferably [d-d1] or smaller.

In the metal substrate processing step (S101), the reflector parts 22, the slits 24, V-grooves 26, and the recesses 21 explained above can be formed simultaneously or separately by a press processing or an etching processing such as half etching. For example, the slits 24 and the perforation slits 28 are formed by a punch processing of the metal substrate 20, then the reflector parts 22 and V-grooves 26 are formed on one surface by a press processing or etching processing, and the recesses 21 and V-grooves 26 of the back face side are formed on the back face by a press processing or etching processing.

Figure 4:
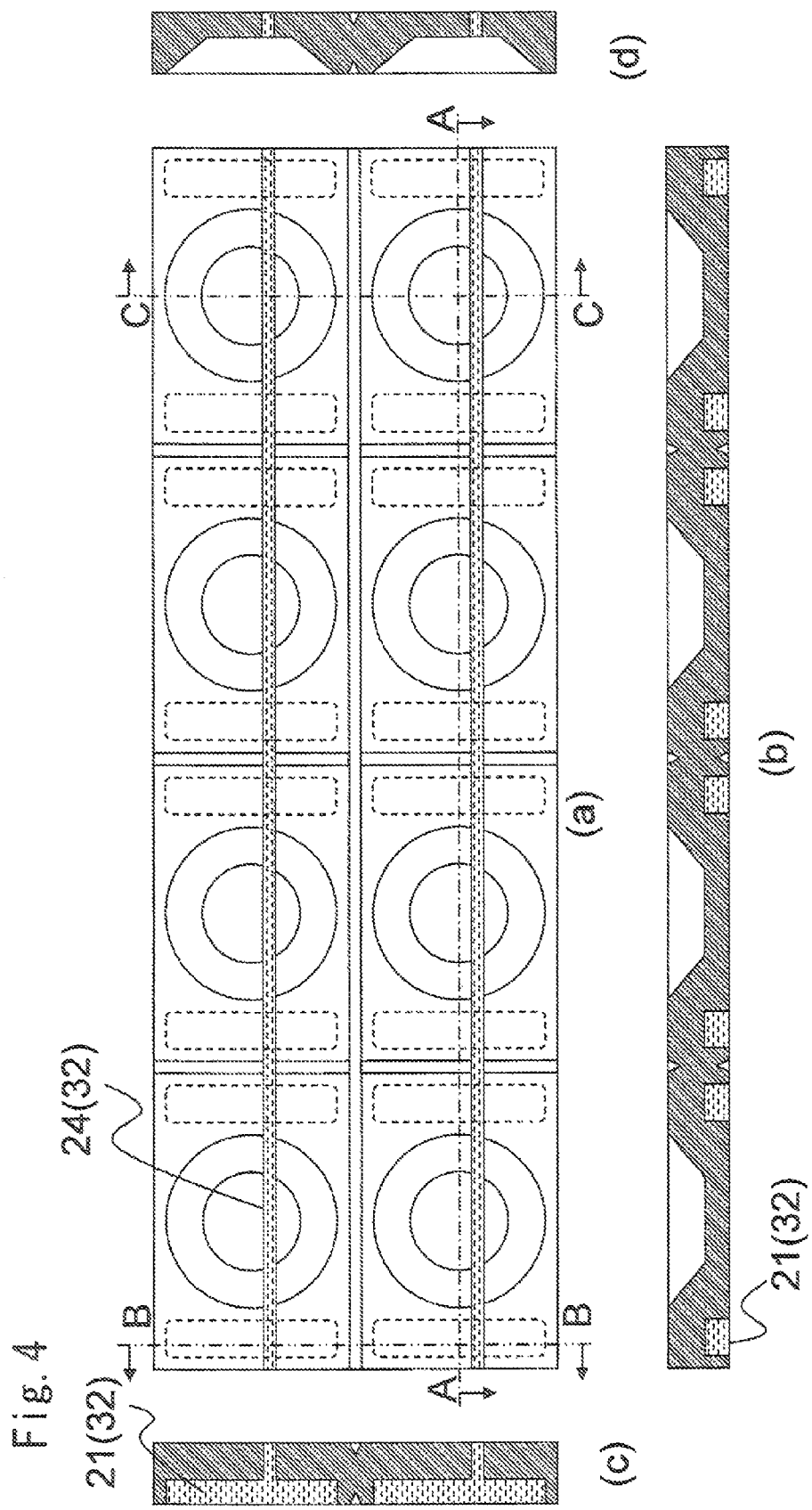
[FIG. 4] Drawings showing the metal substrate of FIG. 3 of which recesses and the like are filled with resin: (a) top view, (b) sectional view along A-A in (a), (c) sectional view along B-B in (a), and (d) sectional view along C-C in (a)

Then, in the resin filling step (S102), a resin is injected and filled into the slits 24 and the recesses 21 of the metal substrate processed in the step (S101) with a dispenser. FIG. 4 shows a state that the slits 24 and the recesses 21 are filled with the resin 32, and (a) to (d) are a top view, a sectional view along the line A-A, a sectional view along the line B-B, and a sectional view along the line C-C, respectively.

As the resin 32 to be filled in the slit 24 and the recess 21, a heat-resistant insulating resin is used. Moreover, in order to efficiently output lights from the LED element outside, a material having a high reflectance is preferred. Furthermore, in order that the heat emitted by the LED element can be more easily radiated, a material showing a good thermal conductivity is preferred. As such a material, for example, silicone resins, epoxy resins, and other known insulating engineering plastics can be used. To these resins, a white pigments such as titanium dioxide and alumina may be added in order to enhance reflectivity and heat radiation property in such an extent that the adhesion property should not be degraded. The resins to be filled in the slit 24 and the recess 21 may be resins of the same type or different types. If resins of the same type are used, it becomes possible to simultaneously inject the resins into the slit 24 and the recess 21.

The resin may be injected into the slit 24 and the recess 21 from the slit side or the recess side at one time, or the injection may be divided into two times of injections. The injection scheme can be appropriately chosen according to the shape of the recess 21, viscosity of the resin to be injected, and so forth. This step is completed by curing the injected resin.

Figure 5:
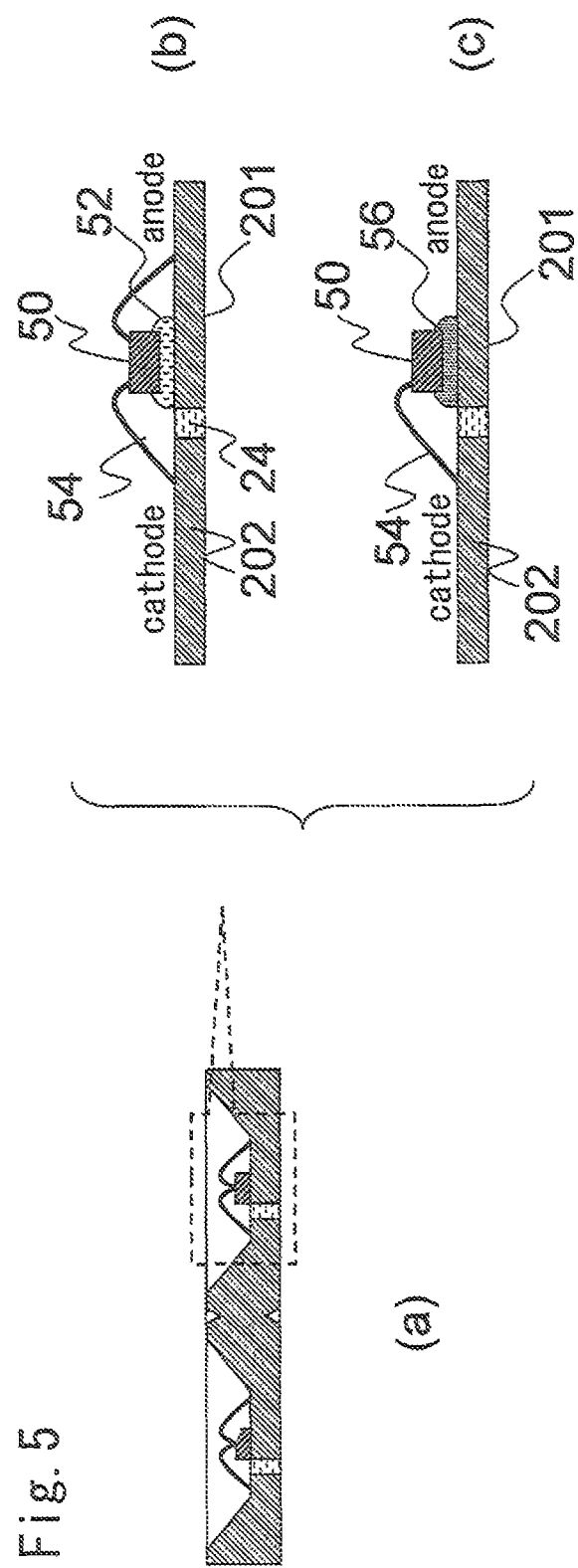
[FIG. 5] (a) to (c) are drawings for explaining a method for mounting LED elements on the metal substrate of FIG. 4

In the light emitting element part forming step (S103), as shown in FIG. 5, (a), the LED element 50 is fixed on each of the reflector parts 22, and electrically connected. The connection method differs according to the type of the LED element. For example, in the case of an LED element 50 in which two electrodes are formed on one surface as shown in FIG. 5, (b), the surface of the LED element on which the electrodes are not formed is die bonded to the reflector part with an adhesive 52, and then the two electrodes on the top surface are wire bonded to the portions 201 and 202 of the metal substrate 20 on both sides of the slit 24, which are insulated from each other, respectively, with Au wires 54 or the like. Further, in the case of an LED element 50 in which anode and cathode are formed on different surfaces as shown in FIG. 5, (c), for example, the back face of the LED element on which the anode electrode is formed is adhered to the reflector part with a conductive material 56 such as a solder paste or an adhesive in which Ag particles are dispersed to also attain electric connection, and the cathode formed on the other surface is wire bonded with an Au wire 54 or the like to the insulated portion 202 of the metal substrate 20 on the other side of the slit 24.

Figure 6:
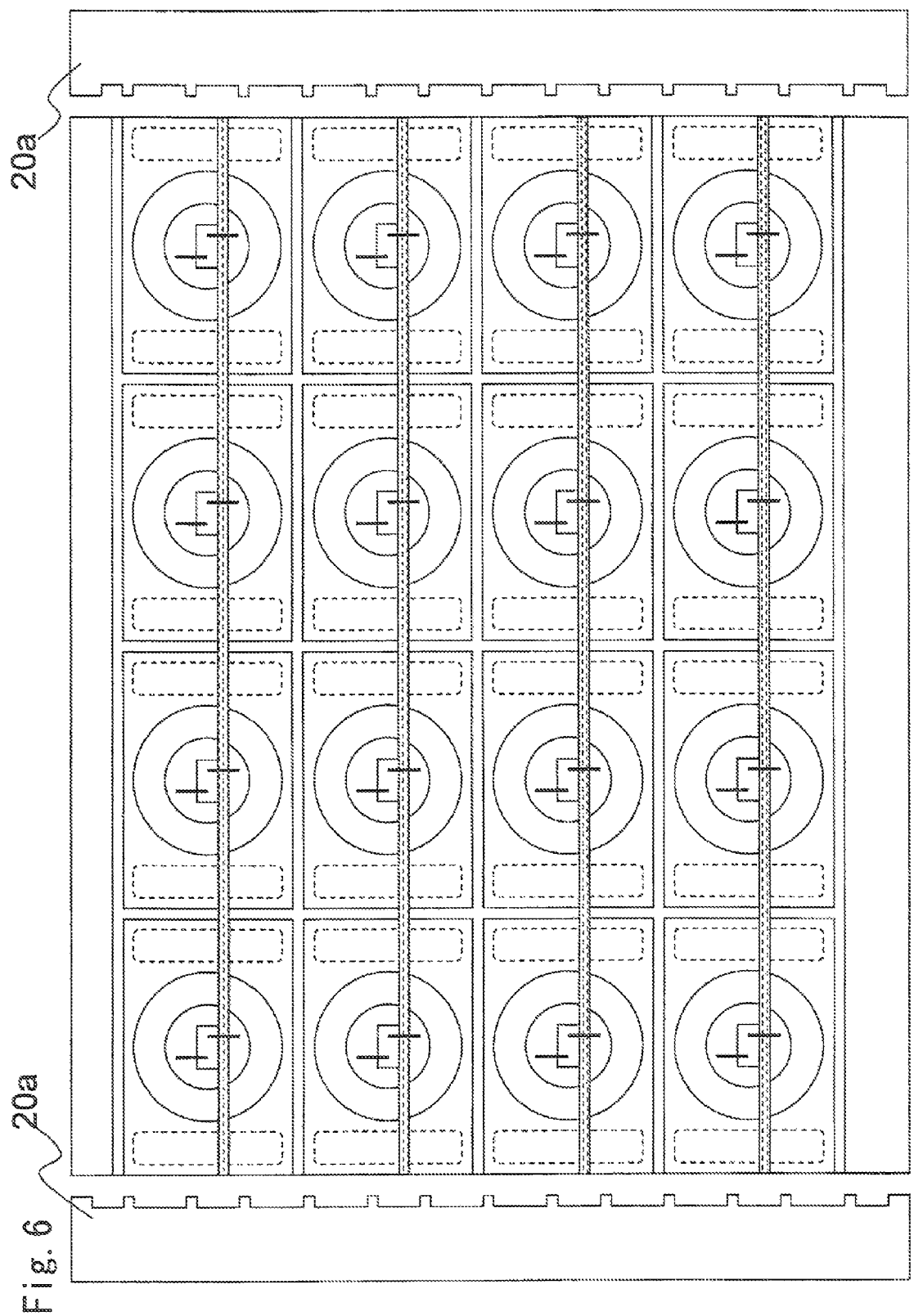
[FIG. 6] Drawings showing a metal substrate carrying LED elements after cutting peripheral parts thereof

After the metal substrate and the LED elements are connected, both peripheral portions 20a of the metal substrate are separated as shown in FIG. 6, and a power-on test is performed. This step is for confirming whether there is any defect in die bonding and wire bonding performed in the previous step, as well as the LED elements, and is performed by electrifying between one end of the metal substrate 20, and another end of a diagonal position. Then, each reflector part 22 is filled with a sealing material 70 such as an epoxy resin to complete the step of forming individual light emitting element (S103). A wavelength conversion material that changes wavelength of light emitted by the LED element, such as a fluorescent substance, may be added to the sealing material 70 to be filled in the reflector part 22, as required. For example, by injecting a resin 70 containing a fluorescent substance into the reflector on which a blue LED element is mounted, a white light source can be realized.

Then, in the dividing step (S104), the substrate is separated into units comprising one or more of light emitting element parts depending on use thereof. These units are called packages. The light emitting element parts can be separated by dicing or the like, or by splitting the substrate by hand. When the V-grooves 26 are formed on the both sides of the metal substrate 20, the light emitting element parts can be easily separated without breaking the metal substrate. Since the V-grooves 26 and the recesses 21 as the resin reservoirs do not cross each other, shaving dusts are not generated from the resin 32 at the time of dicing.

Figure 7:
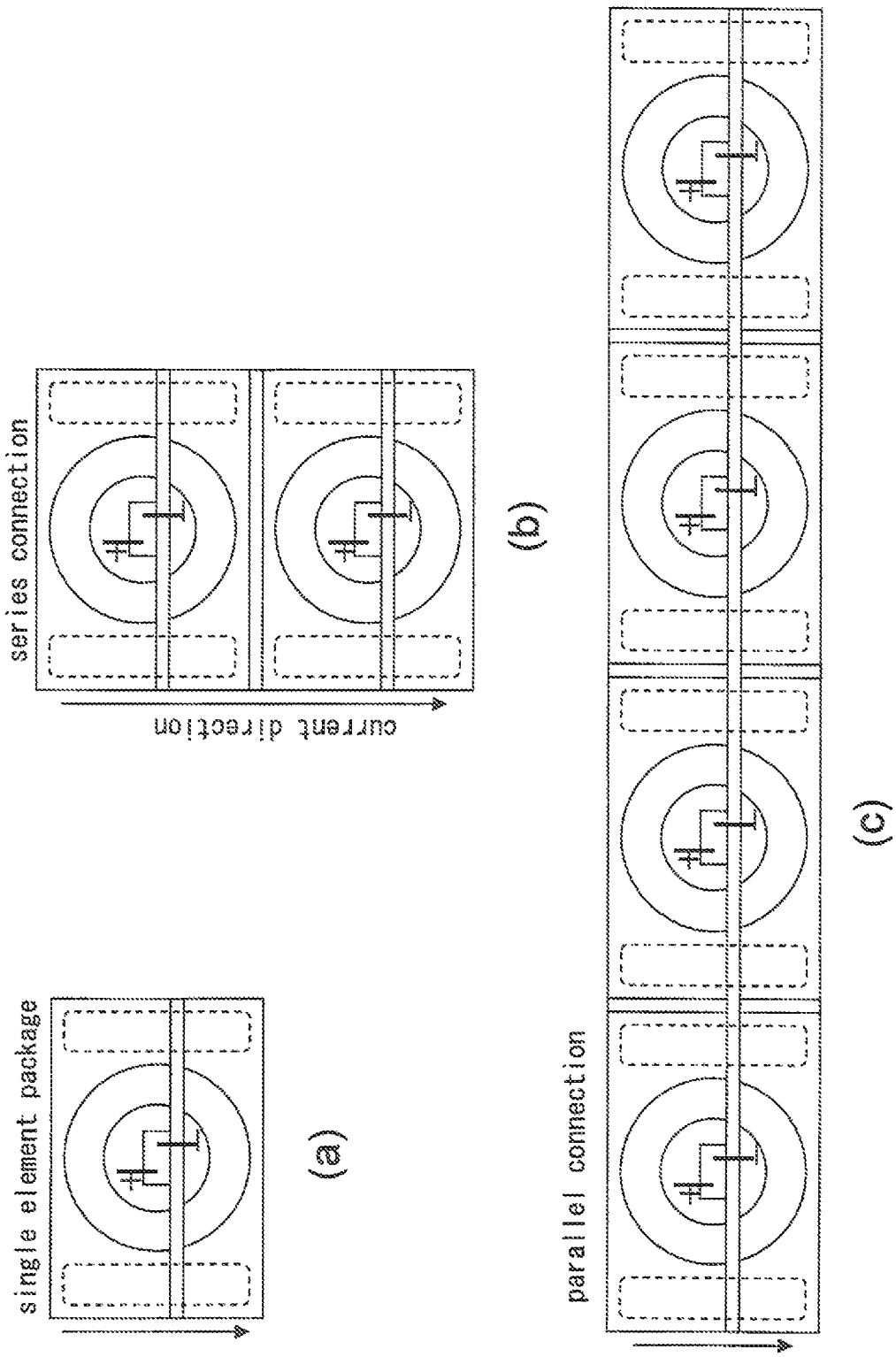
[FIG. 7] (a) to (c) are drawings showing examples of separation of packages

Separated light emitting element parts are shown in FIGS. 7, (a) to (c). In the drawings, the arrows show the electrification direction. FIG. 7, (a) shows a light emitting element part separated as a single light emitting element part, and it is used for light emitting devices comprising single element packages. FIG. 7, (b) shows light emitting element parts comprising a plurality of light emitting element parts (two light emitting element parts in the drawing) separated by cutting the metal substrate 20 along V-grooves 26 in the direction perpendicular to the slits 24. In this case, two of the light emitting element parts are connected in series. FIG. 7, (c) shows light emitting element parts comprising a plurality of light emitting element parts (four light emitting element parts in the drawing) separated by cutting the metal substrate 20 along V-grooves 26 in the direction parallel to the slits 24, and the four light emitting element parts are connected in parallel.

The light emitting element parts divided into units comprising them in a number chosen according to use thereof by a dividing method also chosen according to use thereof are subjected to a metal plating processing with a metal 82 such as Ni, Ni—Au and Su for the whole back face of the metal substrate as shown in FIG. 8, (a), and then mounted on a printed circuit board 80 on which a circuit pattern 81 is formed with solder 83 as shown in FIGS. 8, (b) and (c) to complete the light emitting device 100 (mounting step (S105)).

According to this embodiment, the recesses 21 for serving as resin reservoir are formed in regions of the metal substrate, which carries the LED elements, other than the regions corresponding to back sides of the LED elements (regions directly under the LED elements with respect to the metal substrate thickness direction) so that the recesses should intersect with the slits for insulation, and thereby breakage of the metal substrate at the slits can be prevented to improve workability in the steps after separating the peripheral parts of the metal substrate. In particular, since the longer side direction of the recesses 21 corresponds to the direction perpendicular to the slits, a marked reinforcing effect can be obtained.

Moreover, since the resin reservoirs are provided in regions other than regions directly under the LED elements, the heat radiation property of the metal substrate for the heat from the LED elements is not degraded, and favorable heat radiation property can be maintained. Furthermore, according to this embodiment, the resin reservoirs are formed in the back face opposite to the surface on which the LED elements are provided, therefore the LED elements can be mounted on the surface at a high density, and a high reflectance of the metal substrate can be maintained.

Further, since the resin reservoirs are provided in regions other than regions for division of the light emitting element parts (V-grooves), stresses applied to the LED elements or wires can be reduced in the dividing step, and generation of dusts by dicing can be suppressed.

As for the explanation of the first embodiment of the present invention described above, various modifications are possible for the shape and position of the recess 21, and the shape of the reflector.

<Second Embodiment>

This embodiment differs from the first embodiment in the shape of the recess 21. The other configurations and the production steps (S101 to S105) are the same as those of the first embodiment, and therefore explanations thereof are omitted.

Figure 9:
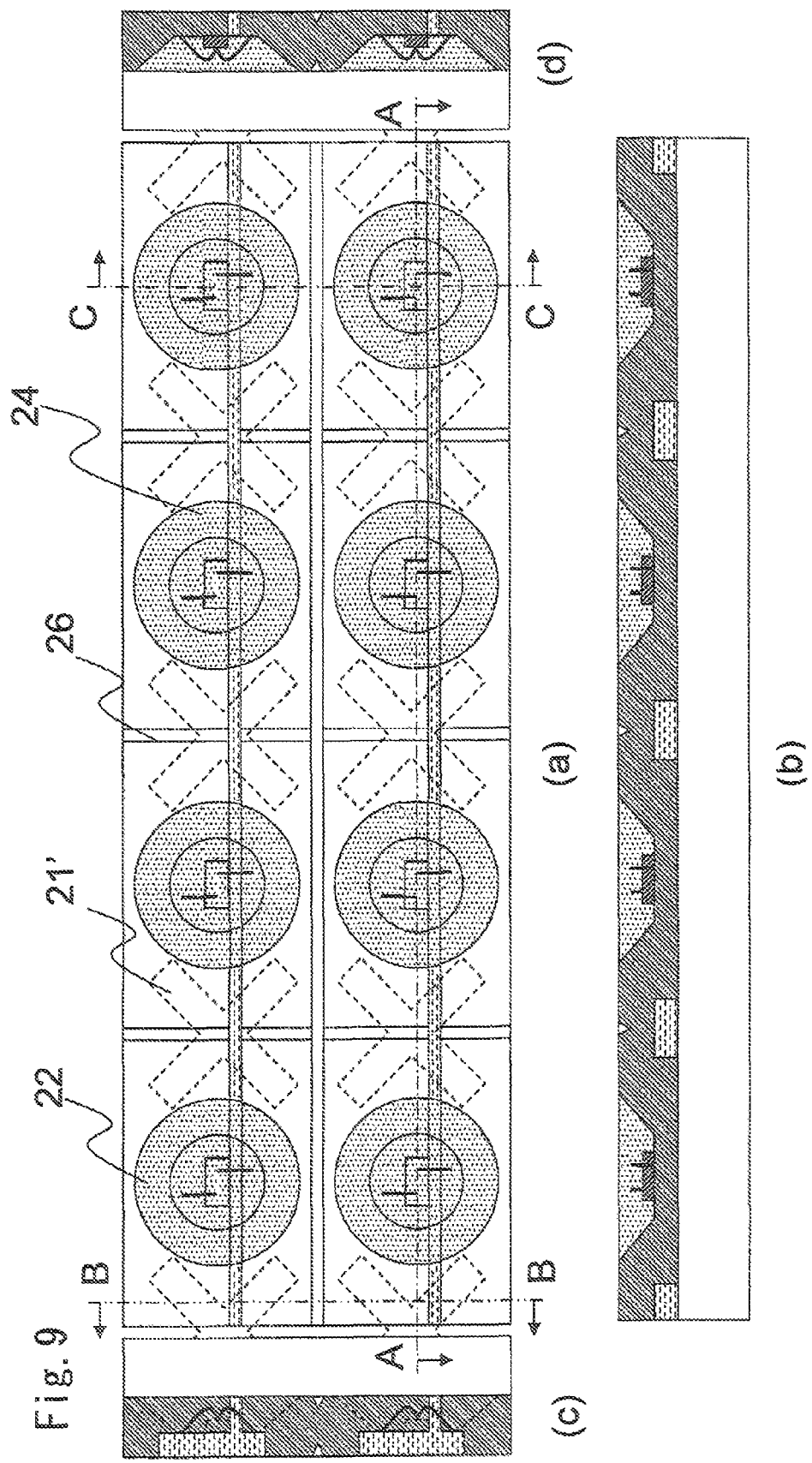
[FIG. 9] Drawings showing the light emitting devices according to the second embodiment: (a) top view, (b) sectional view along A-A in (a), (c) sectional view along B-B in (a), and (d) sectional view along C-C in (a)

FIG. 9 shows a state of the metal substrate etc. at the end of the light emitting element part forming step (S103) in the method for manufacturing a light emitting device according to this embodiment. Also in FIG. 9, (a) to (d) are a top view, a sectional view along the line A-A, a sectional view along the line B-B, and a sectional view along the line C-C thereof, respectively. As shown in FIG. 9, according to this embodiment, in the metal substrate processing step (S101), X-shaped recesses 21' are formed on the back face of the metal substrate 20 opposite to the surface on which reflector parts are formed, and in the resin filling step (S102), a resin is filled into the recesses 21' as resin reservoirs. Also in this embodiment, the recesses 21' are positioned in regions other than the regions of the reflector part 22 directly under the portions on which the LED element are fixed, and the recesses 21' intersect with the slits 24, as in the case of the first embodiment.

According to this embodiment, the adhesion of the resin filled in the slits 24 and the metal substrate can be reinforced by the resin reservoirs, and breakage thereof can be prevented in the production steps without degrading the heat radiation property and reflectivity of the metal substrate, as in the case of the first embodiment. Since the recesses 21' have an X-shape, they partially overlap with the V-grooves 26 for separating light emitting element parts as upper and lower portions with respect to the substrate thickness direction. However, as for packages consisting of a plurality of light emitting element parts, for example, strength of V-grooves 26 at which the light emitting element parts are not separated can be enhanced.

<Third Embodiment>

This embodiment differs from the first and second embodiments in the position at which the recess 21 is formed. The other configurations and the production steps (S101 to S105) are the same as those of the first embodiment, and therefore explanations thereof are omitted.

Figure 10:
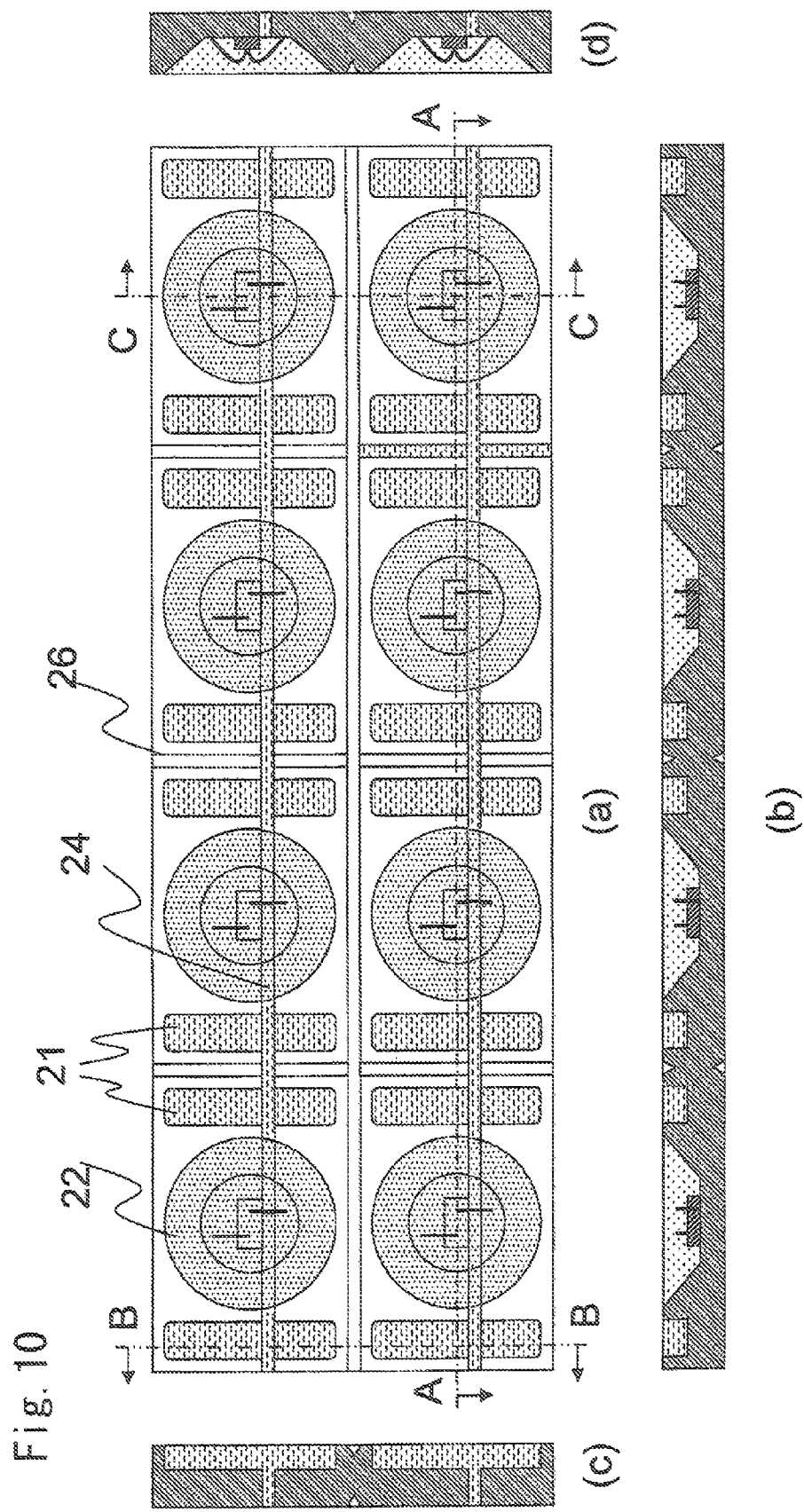
[FIG. 10] Drawings showing the light emitting devices according to the third embodiment: (a) top view, (b) sectional view along A-A in (a), (c) sectional view along B-B in (a), and (d) sectional view along C-C in (a)

FIG. 10 shows a state of light emitting devices under production by the method for manufacturing a light emitting device according to this embodiment at the end of the light emitting element part forming step (S103). Also in FIG. 10, (a) to (d) are a top view, a sectional view along the line A-A, a sectional view along the line B-B, and a sectional view along the line C-C thereof, respectively.

As shown in FIG. 10, according to this embodiment, in the metal substrate processing step (S101), the recesses 21 are formed on both sides of each reflector part on the surface of the metal substrate 20 on which the reflector parts 22 are formed, so that the recesses should cross the slits 24, and in the step (S102), a resin is filled into the recesses 21 to form resin reservoirs. Depth of the recess 21 is preferably 0.1 mm or larger in order to improve the adhesion, and in order to maintain high radiation property, the depth is preferably smaller than the depth of the reflector part. Moreover, in this embodiment, in order to maintain high reflectivity of the surface on which the LED element is carried, a material of high reflectance containing a white pigment such as titanium dioxide is used as the resin to be filled in the recess 21. In the drawings, the recesses 21 substantially have a shape of rectangular parallelepiped as in the case of the first embodiment, but the shape is not limited to this shape, the recess may have, for example, an X-shape similar to that of the second embodiment, and when there is no V-grooves 26 perpendicularly intersecting with the slits 24, two adjacent recesses 21 may combined to form one recess.

According to this embodiment, the adhesion of the resin and the metal substrate can be enhanced without degrading the heat radiation property and reflectivity of the metal substrate, as in the case of the first and second embodiments. Moreover, according to this embodiment, the recesses 21 are formed on the same surface as the reflector parts 22, they can be formed by one press processing operation from one side in the step (S101). Also in the step (S102), filling with the resin using a dispenser can be performed from the same surface side, and thus the steps can be simplified. Moreover, since the portions of the metal substrate 20 under the reflector parts are not shaded by the recesses 21, the high radiation effect can be obtained by the metal substrate 20.

<Fourth to Sixth Embodiments>

These embodiments are modifications of the first to third embodiments aiming at further improvement in strength. For the same configurations as those of the first embodiment, explanations are omitted.

Figure 11:
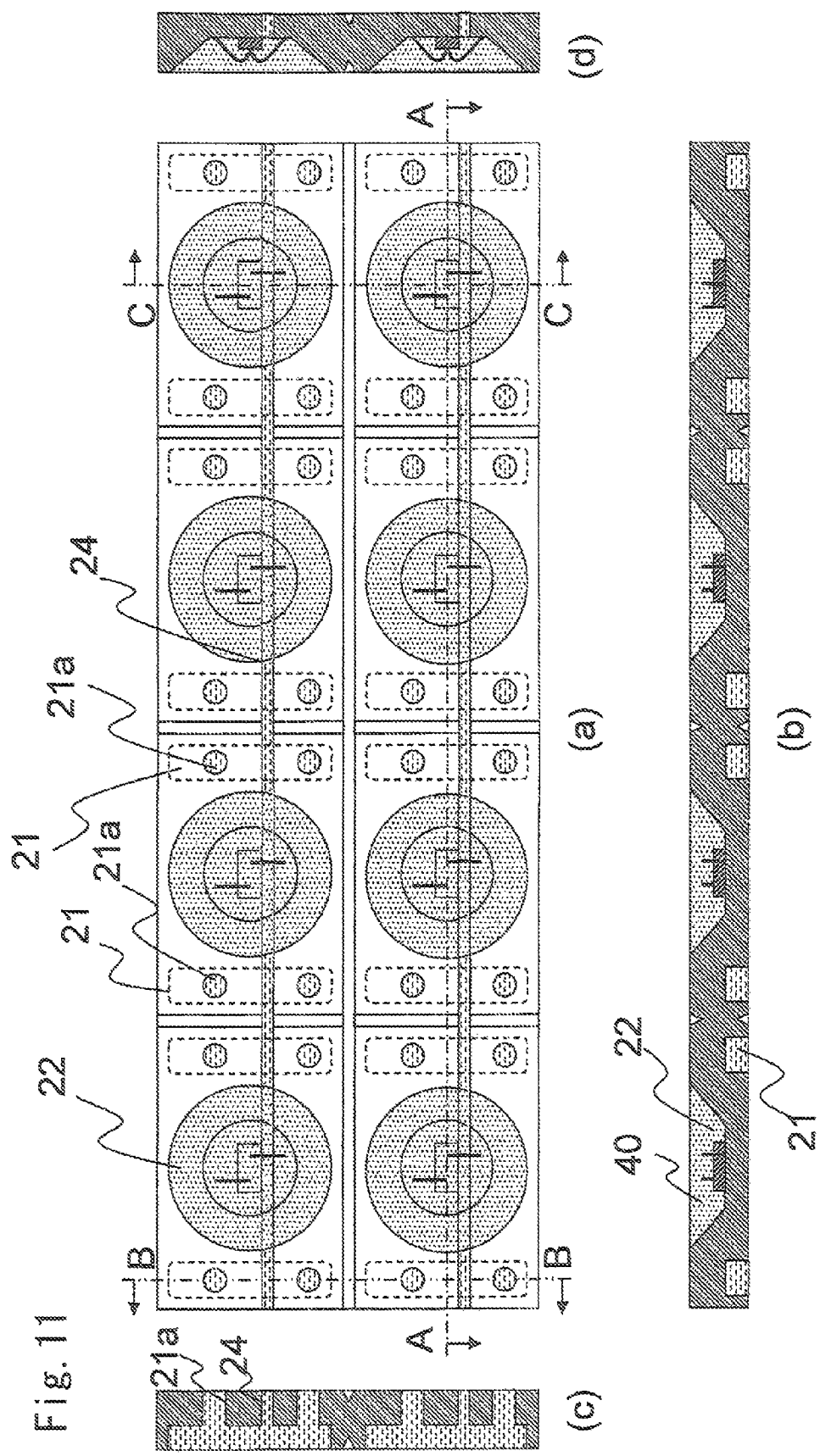
[FIG. 11] Drawings showing the light emitting devices according to the fourth embodiment: (a) top view, (b) sectional view along A-A in (a), (c) sectional view along B-B in (a), and (d) sectional view along C-C in (a)

FIG. 11 shows a state of the metal substrate etc. at the end of the light emitting element part forming step (S103) of the method according to the fourth embodiment. Also in this embodiment, on the back face of the metal substrate 20 opposite to the surface on which reflector parts are formed (defined to be the surface), the recesses 21 are formed in regions other than the regions directly under the reflector parts, as in the case of the first embodiment. But in this embodiment, through-holes 21a penetrating the metal substrate up to the surface are formed. Although two through-holes 21a are shown for every recess 21 in the drawings, one or three or more through-holes 21a may be provided.

This embodiment provides the same effect as that of the first embodiment, but the recess 21 has the through-holes 21a, and the adhesion of the resin and the metal substrate can further be improved. Moreover, when the resin is filled by using a dispenser in the step (S102), the resin can be filled from the surface side into the slits 24 as well as the recesses 21 through the through-holes 21a. The resin may of course be filled from both sides, in order to surely fill the resin into the recesses 21.

Figure 12:
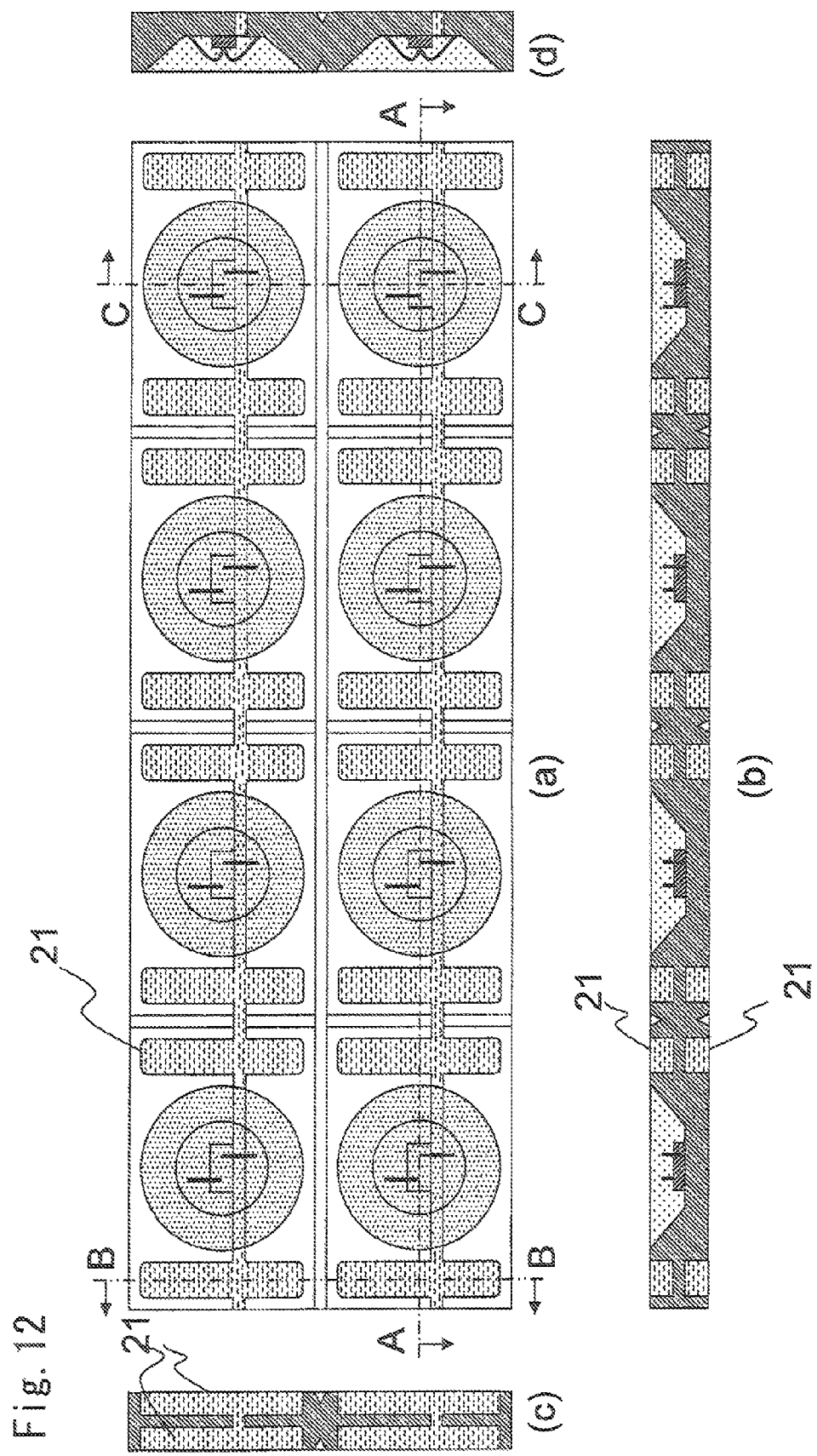
[FIG. 12] Drawings showing the light emitting devices according to the fifth embodiment: (a) top view, (b) sectional view along A-A in (a), (c) sectional view along B-B in (a), and (d) sectional view along C-C in (a)

FIG. 12 shows a state of the metal substrate etc. at the end of the light emitting element part forming step (S103) of the method according to the fifth embodiment. In this embodiment, the recesses 21 of the same shape are provided on both sides of the metal substrate 20, i.e., the surface on which the reflector parts are formed, and the back face thereof, to improve adhesion of the resin and the metal substrate. As the resin filled in the recesses 21, a resin showing a high reflectivity is used in order to maintain high reflectivity of the surface on which the LED elements are carried, as in the case of the third embodiment.

Figure 13:
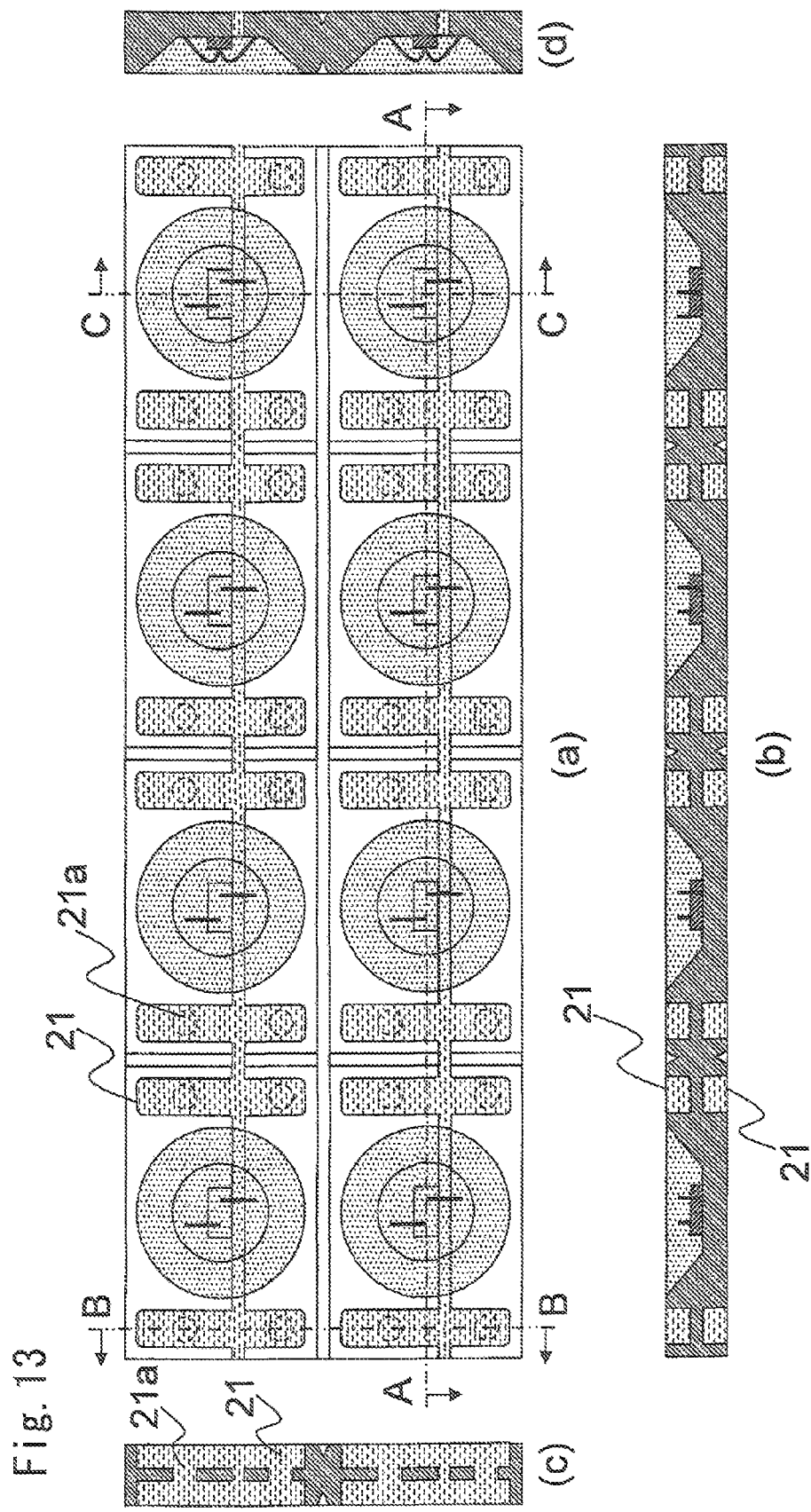
[FIG. 13] Drawings showing the light emitting devices according to the sixth embodiment: (a) top view, (b) sectional view along A-A in (a), (c) sectional view along B-B in (a), and (d) sectional view along C-C in (a)

The sixth embodiment is for improving workability of the resin filling operation of the fifth embodiment, and is characterized in that through-holes 21b are formed between the recesses 21 provided on the up side and the lower side as shown in FIG. 13, in addition to the slits 24. The number of the through-holes 21b is not limited to two shown in the drawings. According to this embodiment, adhesion of the resin and the metal substrate can be further improved, and since the two upper and lower recesses 21 are connected by the through-holes 21b, the resin can be filled from one side (surface side) in the step (S102), and thus the steps can be simplified.

In FIGS. 11 to 13, the recesses 21 having the same shape as that of the first embodiment are shown. However, the shape of the recess 21 can be appropriately changed as in the case of the third embodiment.

<Seventh and Eighth Embodiments>

In the first to sixth embodiments, the recesses 21 are formed separately from the reflector parts 22, and are used as resin reservoirs. However, in the embodiment described below, the reflector parts themselves are used as resin reservoirs. The production steps are the same as the production steps of the first embodiment shown in FIG. 1, provided that, in the metal substrate processing step (S101), the reflector parts 22, slits 24, V-grooves 26, and perforation slits 28 are formed. Recesses corresponding to the recesses 21 of the first to sixth embodiments may not be provided. Further, in the resin filling step (S102), a resin is filled in only a part of a plurality of the reflector parts 22 formed in the step (S101) to form resin reservoirs, and in the light emitting element part forming step (S103), LED elements are die bonded in the reflector parts other than those filled with the resin to form light emitting element parts.

Figure 14:
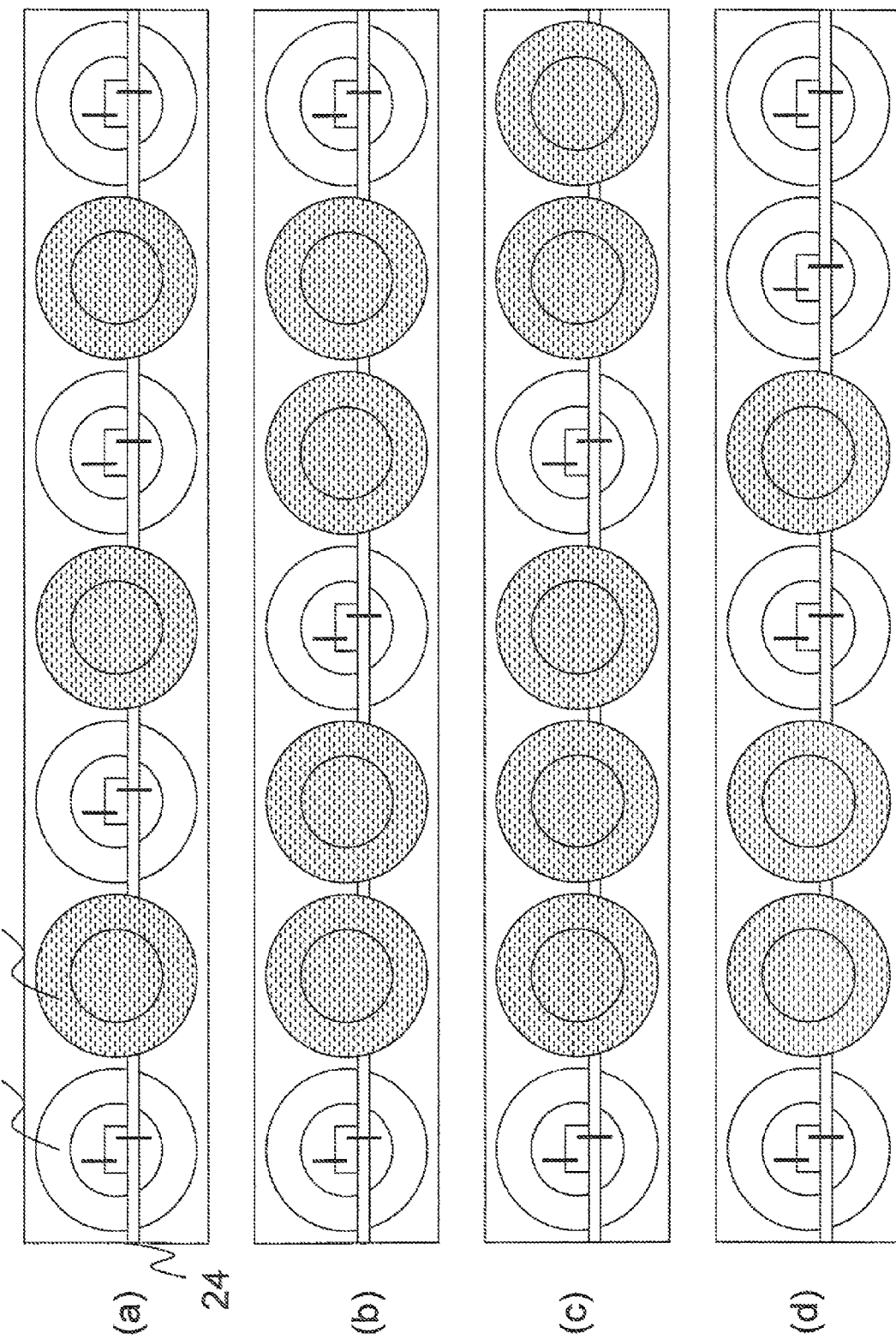
[FIGS. 14] (a) to (d) are top views of the light emitting devices according to the seventh embodiment

FIGS. 14, (a) to (d) show the seventh embodiment. Although the drawings show cases where a plurality of light emitting element parts are arranged in one horizontal row, there may be a plurality of rows as in the embodiment shown in FIG. 2. According to this embodiment, in the metal substrate processing step (S101), a plurality of reflector parts 22 of the same shape are formed at predetermined intervals (relatively small intervals). In this step, the slits 24, the V-grooves 26, and the perforation slits 28 are formed as in the case of the first embodiment. However, recesses corresponding to the recesses 21 on the back face may not be formed. In the resin filling step (S102), the resin is filled in the reflector parts 22b except for a part of a plurality of the reflector parts 22, the reflector parts 22a. The reflector parts 22a used for light emitting element parts are chosen so that pitches of the chosen reflector parts should be element pitches of the intended light emitting device. FIG. 14, (a) shows a case where the resin is alternately filled, (b) shows a case where three reflector parts constitute a unit, and the resin is filled in the second and third reflector parts 22a among them, and (c) shows a case where four reflector parts constitute a unit, and the resin is filled in the second to fourth reflector parts 22a among them. (d) shows a case of producing light emitting element parts for one-element package, and light emitting element parts for multiple element package, and the resin is filled in the second, third and fifth reflector parts 22b among a plurality of the reflector parts.

In the light emitting element part forming step (S103), LED elements are die bonded and wire bonded in the reflector parts 22a not filled with the resin in the step (S102) to form light emitting element parts. Then, the light emitting element parts are separated into individual packages (dividing step S104), and mounted on a printed circuit board (mounting step S105) to produce a light emitting device.

Figure 15:
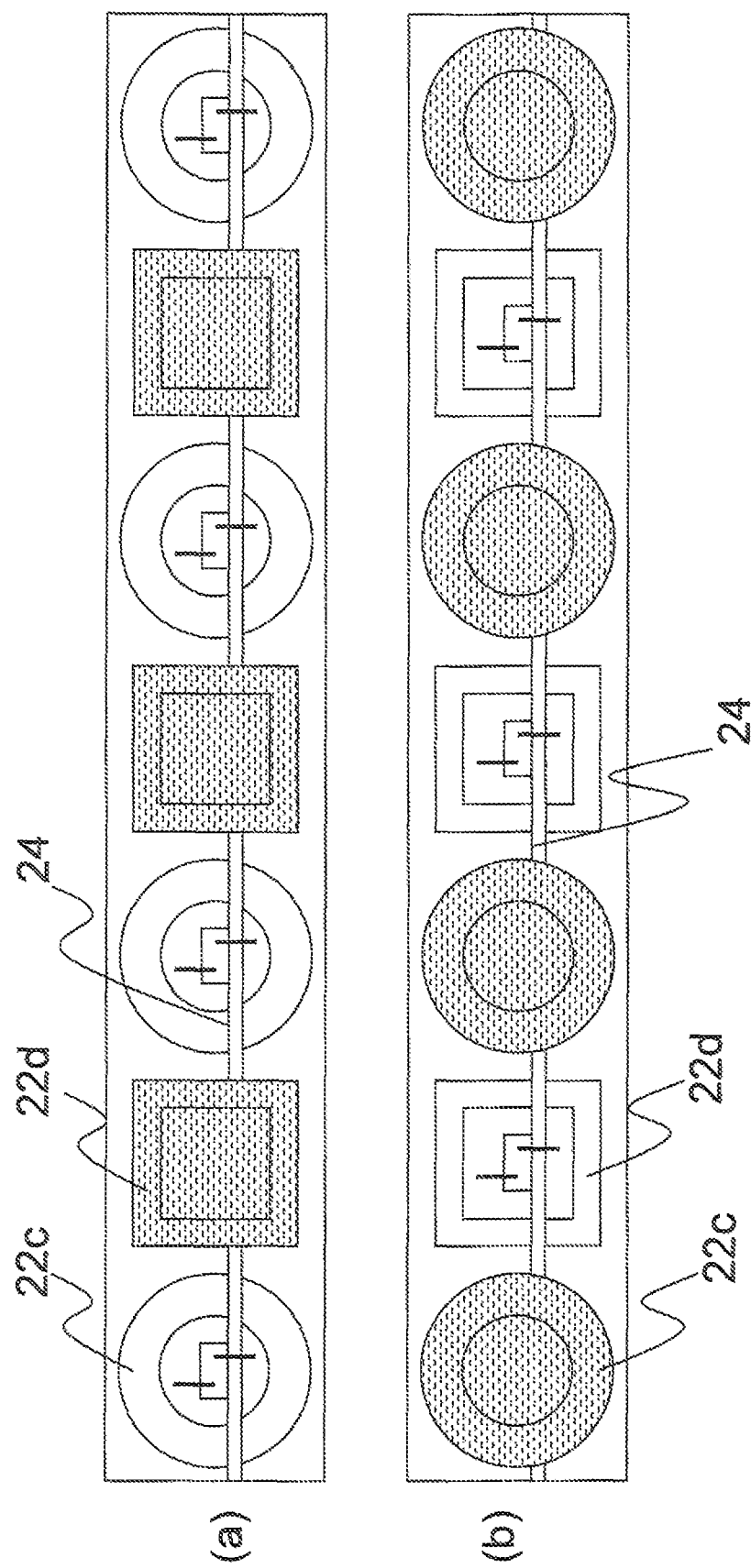
[FIGS. 15] (a) and (b) are top views of the light emitting devices according to the eighth embodiment

FIG. 15 includes drawings showing the eighth embodiment. According to this embodiment, in the metal substrate processing step (S101), a plurality of kinds of reflector parts having different shapes are alternately formed. In the drawings, two kinds of reflector parts having a circular shape 22c and a square shape 22d as observed from above are formed. In this step, the slits 24, the V-grooves 26, and the perforation slits 28 are formed as in the case of the first embodiment. However, recesses corresponding to the recesses 21 on the back face may not be formed. In the resin filling step (S102), the resin is filled in only one kind of the reflector parts having the same shape, for example, only the square-shaped reflector parts 22b (FIG. 15, (a)) or only the circular-shaped reflector parts 22c (FIG. 15, (b)), among a plurality of kinds of reflector parts, and LED elements are mounted on the reflector parts in which the resin was not filled.

According to this embodiment, a plurality of kinds of light emitting devices having reflector parts of different shapes can be produced by using one metal substrate.

As described above, the seventh and the eighth embodiments are suitable for forming various and diverse light emitting devices, such as light emitting devices having different pitches of light emitting elements or different shapes of the reflectors, from one metal substrate.

<Ninth Embodiment>

Figure 16:
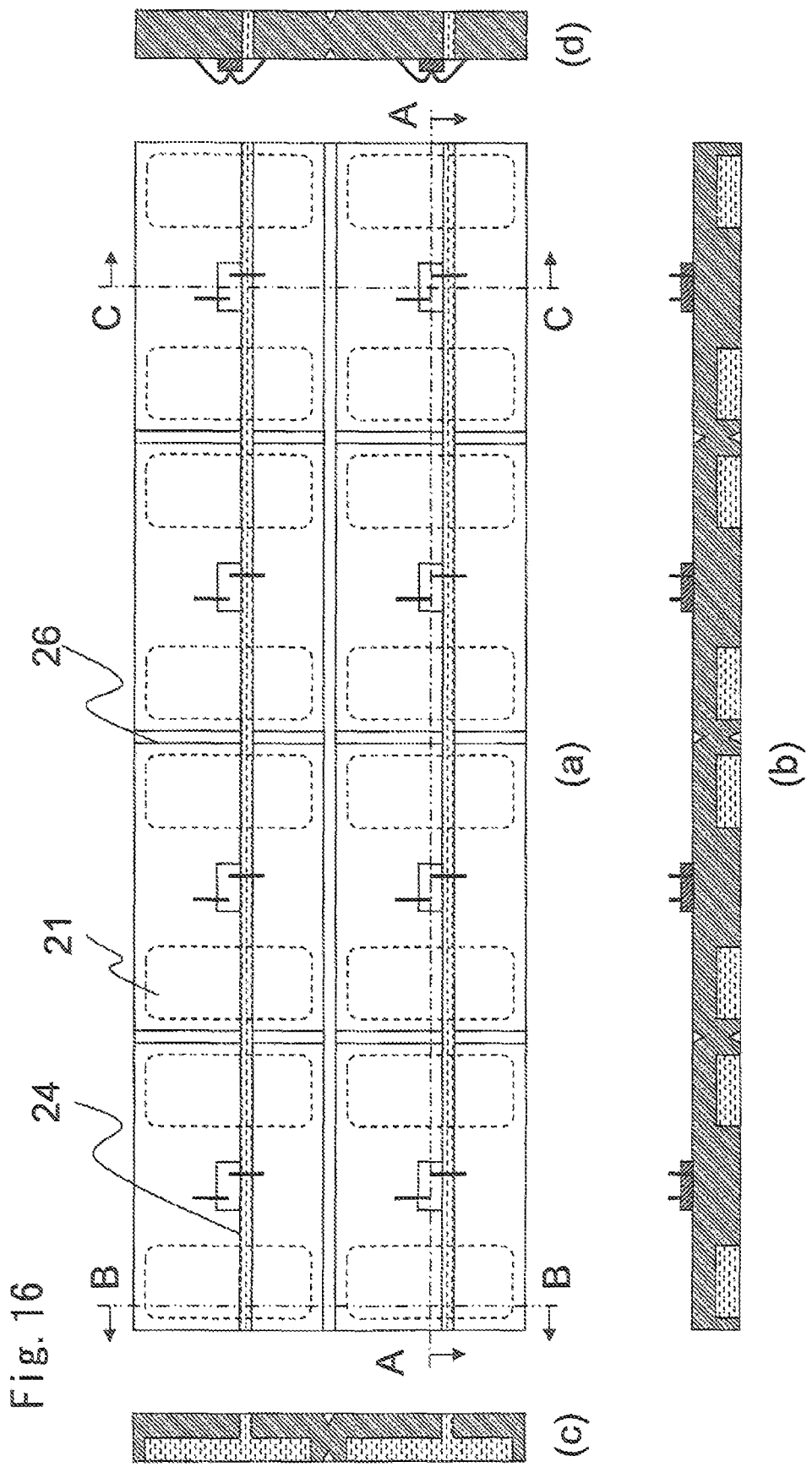
[FIG. 16] Drawings showing the light emitting devices according to the ninth embodiment: (a) top view, (b) sectional view along A-A in (a), (c) sectional view along B-B in (a), and (d) sectional view along C-C in (a)

As for the first to eighth embodiments explained above, those cases where the reflector parts are formed in the metal substrate are explained. However, the present invention can also be applied to a case where reflector parts (recesses in the shape of reversed truncated cone) are not formed in the metal substrate. Such an embodiment is shown in FIG. 16. According to this embodiment, in the metal substrate processing step S101, the V-grooves 26 and the perforation slits (not shown) are formed, the slits 24 crossing regions for forming light emitting element parts surrounded by the V-grooves 26 (regions where LED elements are fixed in the step (S103)) are formed, and the recesses 21 serving as resin reservoir are formed in the aforementioned regions. The recesses 21 are formed on the surface or back face of the substrate at such positions that the recesses should intersect with the slits 24.

As the reflectors, those separately prepared may be adhered after the dividing step (S104), or they may be formed in regions other than the regions of the V-grooves 26 prior to the dividing step, as required. Generation of shaving dusts of the resin constituting the reflectors can be thereby prevented.

<Tenth Embodiment>

In the methods for producing a light emitting device according to the first to ninth embodiments, the resin is filled in the slits and the recesses for serving as resin reservoir, and then LED elements are mounted. In contrast, the method for manufacturing a light emitting device according to this embodiment is characterized in that reflector parts having convex portions for carrying LED elements are formed on a metal substrate, LED elements are mounted on these convex portions, and then a resin is filled in the slits, the recesses for serving as resin reservoir, and bottom portions of the reflector parts. The materials used in the method for manufacturing a light emitting device of this embodiment, specifically, the metal for the metal substrate, LED element, resin to be filled, and resin containing a fluorescent substance are the same as those materials described above, unless specifically mentioned.

Figure 17:
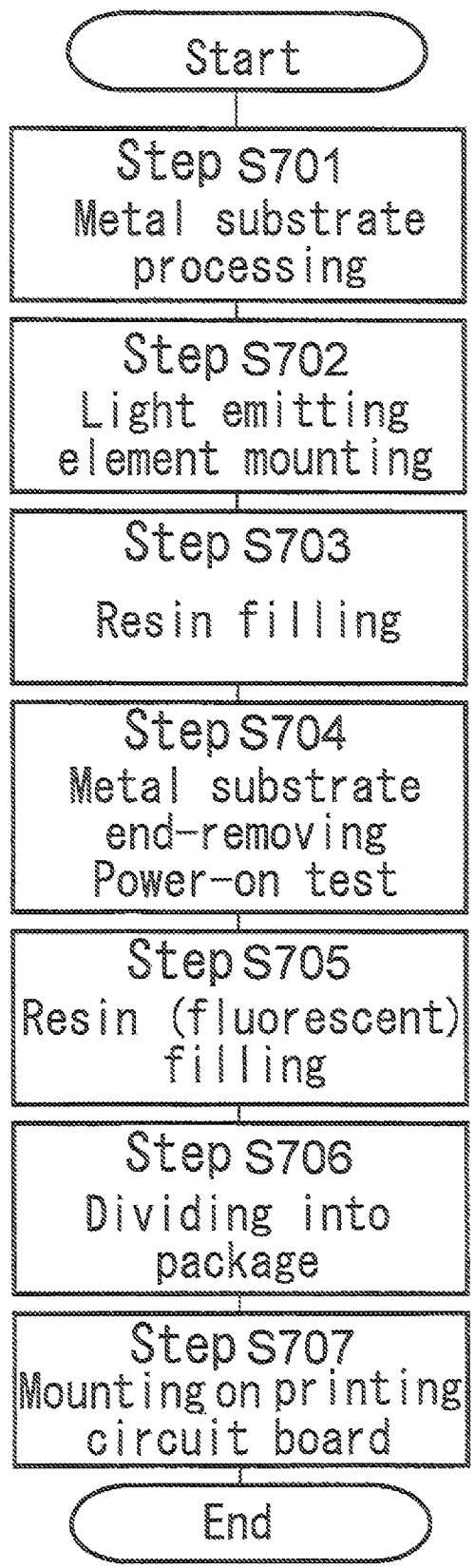
[FIG. 17] A flowchart showing another embodiment of the production process of the light emitting device of the present invention

FIG. 17 shows the procedure of the method for manufacturing a light emitting device according the tenth embodiment, and FIGS. 18 to 22 show light emitting devices in respective steps of the production method (including parts in the middle of the production).

As shown in FIG. 17, the production method of this embodiment mainly consists of a metal substrate processing step (S701) in which a plurality of reflector parts, slits and recesses for serving as resin reservoir are formed in a metal substrate, a light emitting element mounting step (S702) in which light emitting elements are mounted on convex portions of the respective reflector parts, a resin filling step (S703) in which in the slits, recesses for serving as resin reservoir, and bottom portions of the reflector parts are filled with an insulating resin, a step (S704) of eliminating both ends of the metal substrate by cutting and performing a power-on test of the light emitting elements, a step (S705) of filling the reflector parts with a resin containing a fluorescent substance, a dividing step (S706) in which the metal substrate on which the light emitting element parts are formed is divided into units each comprising one or a plurality of light emitting element parts, and a mounting step (S707) in which the divided light emitting element parts are mounted on a printed circuit board.

Among the steps shown in FIG. 17, the step S706 and the step S707 are the same as the step S104 and the step S105 of the production method of the first embodiment shown in FIG. 1. Hereafter, the steps different from those of the first embodiment will be mainly explained.

First, in the metal substrate processing step (S701), on one surface of a metal substrate, a plurality of reflector parts are formed, and slits crossing these reflector parts are formed. As the metal substrate, a metal plate having a thickness larger than that of the metal substrate of the first embodiment, specifically a thickness of about 1.4 to 2.0 mm, is used in view of the press processing or handling.

Figure 18:
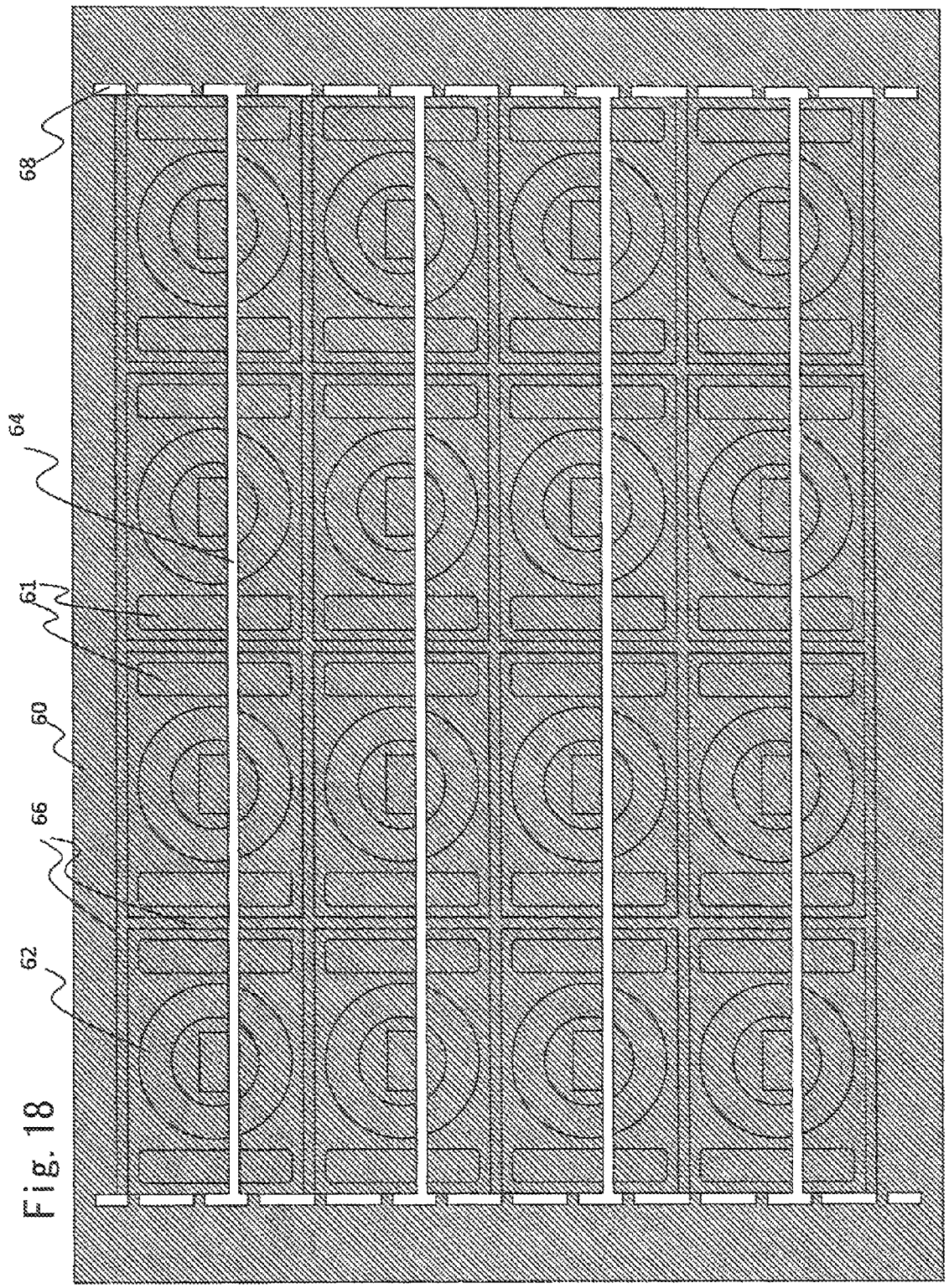
[FIG. 18] A top view of a metal substrate subjected to the metal plate processing according to the tenth embodiment
Figure 19:
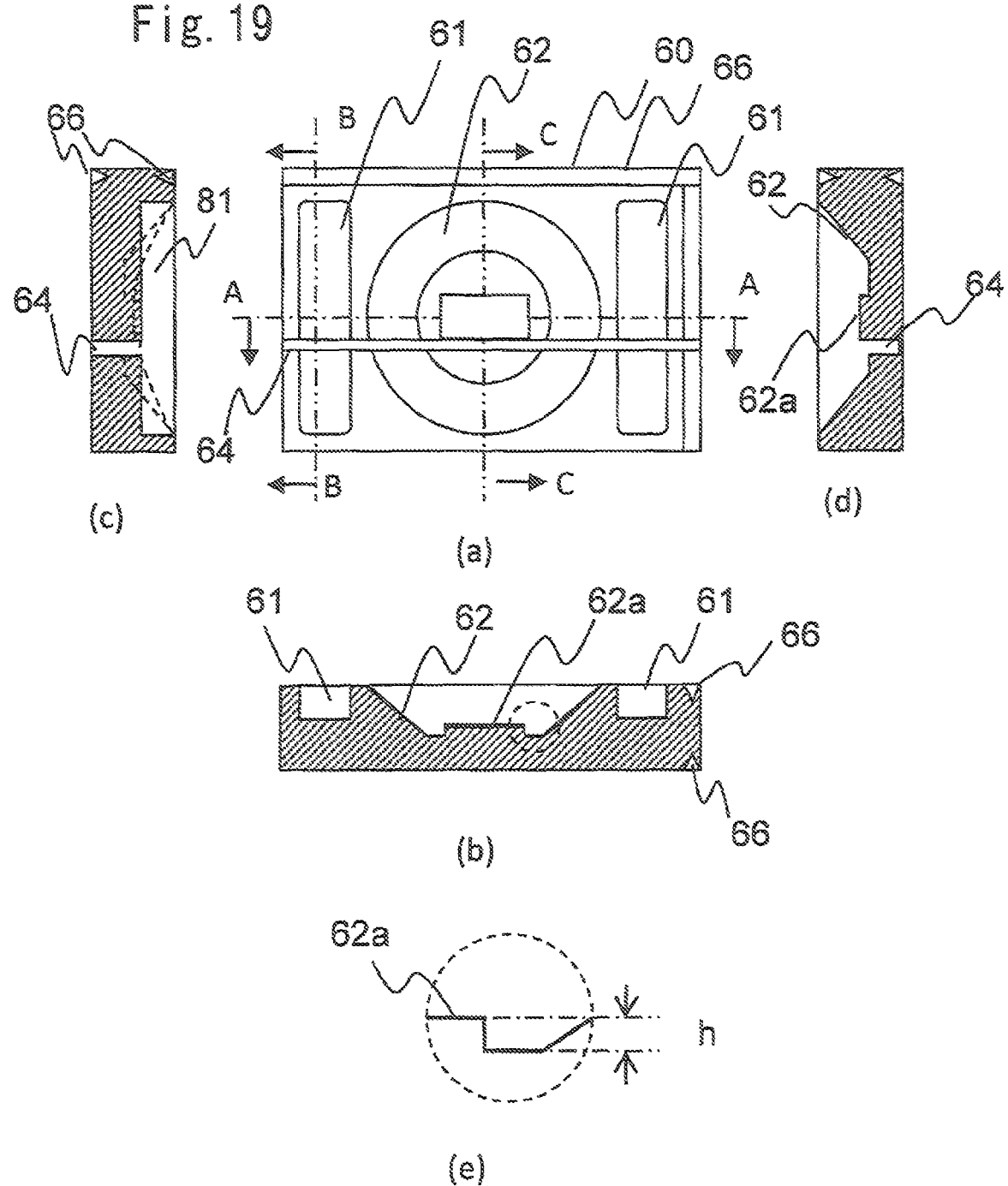
[FIG. 19] Drawings showing a part of a metal substrate subjected to the metal processing of the production method according to the tenth embodiment: (a) top view, (b) sectional view along A-A in (a), (c) sectional view along B-B in (a), (d) sectional view along C-C in (a), and (e) partial enlarged view of (d)

One embodiment of the metal substrate 60 in which the reflector parts 62 and slits 64 have been formed in the step (S701) is shown in FIGS. 18 and 19. FIG. 18 shows the metal substrate 60 observed from above, and the metal portions are indicated with hatching for ease of distinguishing the slits and the other portions. FIG. 19 shows a part of the metal substrate shown in FIG. 18 corresponding to one light emitting element part, where (a) is a top view, (b) is a sectional view along the line A-A in the top view, (c) is a sectional view along the line B-B in the same, (d) is a sectional view along the line C-C in the same, and (e) is a partial enlarged view of (d).

As shown in FIGS. 19, (b) and (d), the reflector part 62 consists of a recess in the form of a reversed truncated cone, and on the bottom surface thereof, a convex portion 62a for die bonding an LED element (convex portion for carrying light emitting element) is formed, and the bottom surface except for the convex portion 62a and the side of the cone are covered with a white resin in the step described later, and function as a reflector for reflecting light emitted from the LED element. The white resin is filled up to the same level as the upper surface of the convex portion 62a or a lower level. In order to obtain a thickness of this white resin sufficient for obtaining reflectivity, the height h of the convex portion 62a is preferably 0.1 mm or larger, and in particular, in order to prevent the white resin from going up to the upper surface of the convex portion 62a, the height h is preferably 0.4 mm or larger, even when the white resin filled in the bottom portion has a thickness of 0.1 mm or larger over the whole surface.

However, the total of the height of the LED element and the height h of the convex portion 62a must be smaller than the depth of the reflector part 62, so that when the reflector part 62 is filled with a resin containing a fluorescent substance, wires used for electric connection of the LED element should not protrude from the upper part, and a thickness of the resin containing fluorescent substance affording uniform color should be secured. Although it also depends on the thickness of the LED element, specifically, the thickness of the resin containing fluorescent substance (distance from the upper surface of the convex portion 62a to the surface of the fluorescent substance-containing resin layer) is preferably about 0.4 to 1 mm. Therefore, the depth of the reflector part 62 is preferably the thickness of the resin containing fluorescent substance plus the height of the aforementioned convex portion 62a or larger, i.e., 0.5 mm or larger. It is especially preferably 0.8 mm or larger. Furthermore, it is preferably determined by adding the thickness of the chip to be mounted, and when a chip having a thickness of 0.1 mm is intended, the depth of the reflector part 62 is preferably 0.6 mm or larger considering the height of the convex portion 62a of 0.1 mm or larger, the thickness of the chip of 0.1 mm, and the thickness of the fluorescent substance-containing resin layer of 0.4 mm or larger.

Moreover, the upper surface of the convex portion 62a desirably has an area larger than the base area of the LED element, and for example, it is desirable that the periphery of the upper surface is larger than the periphery of the element by 0.3 mm or more.

A plurality of the reflector parts 62 having the aforementioned configuration are formed on the rectangular surface of the metal substrate 60 along perpendicularly intersecting two directions at predetermined intervals, as shown in FIG. 18. In the example shown in the drawing, reflector parts are formed in four rows wide and four rows long, but the number of the reflector parts (numbers of rows) is not limited to this example.

In the example shown in the drawing, the reflector part has a shape of reversed truncated cone. However, the shape of the reflector part is not limited to this shape, and it may have a cylindrical shape.

The slits 64 penetrating the metal substrate 60 are provided so that they should cross the rows of the reflector parts 62, and the perforation slits 68 for maintaining the metal substrate 60 in one body are formed at the both ends of the slit 64, as in the case of the first embodiment. The width of the slit is the same as or larger than the thickness of the metal substrate in view of the limit of the processing, when the slit is formed by a press processing. When a metal substrate having a thickness of 1.4 mm is used, the minimum slit width is 1.4 mm. In addition to press processing, the slit can be formed by etching or cutting, and in such a case, the width thereof can be made smaller than the thickness of the metal substrate. As for the position of the slit 64 in the reflector part 62, the slit 64 is positioned outside the convex portion 62a along one end thereof.

Moreover, in regions between two adjacent reflector parts 62 of the metal substrate 60, the recesses 61 for serving as resin reservoir are formed so as to cross the slits 64. In the embodiment shown in the drawings, the shape and the formation position of the recesses 61 for serving as resin reservoir are the same as those of the third embodiment shown in FIG. 10, and two of approximately rectangular parallelepiped-shaped recesses are formed in parallel on the surface on which the reflector part 62 is formed. However, the shape and position can be changed as in the case of the first, second and fourth to sixth embodiments mentioned above. For example, the shape may be such a cross shape as shown in FIG. 9, and the formation position may also be in a region except for the region corresponding to a portion where the reflector part 62 is provided, on the back face side (face opposite to the surface on which the reflector part is provided). Furthermore, it is also possible to provide the recesses for serving as resin reservoir on both sides, or provide through-holes, as in the cases of the embodiments shown in FIGS. 11 to 13.

A plurality of V-grooves 66, perforations or the like are formed along the arrangement direction of the reflector parts 62 in order to make division of the individual reflector parts 62 easy, as in the case of the first embodiment.

In the metal substrate processing step (S701), the recesses 61 for serving as resin reservoir, the reflector parts 62, the slits 64, and the V-grooves 66 explained above can be formed simultaneously or separately by a press processing or an etching processing such as half etching. For example, the slits 64 and the perforation slits 68 are formed by a punch processing of the metal substrate 60, then the recesses 61, the reflector parts 62 and the V-grooves 66 are formed by a press processing or etching processing on one side, and the V-grooves 26 of the back face side are formed on the back face by a press processing or etching processing.

Figure 20:
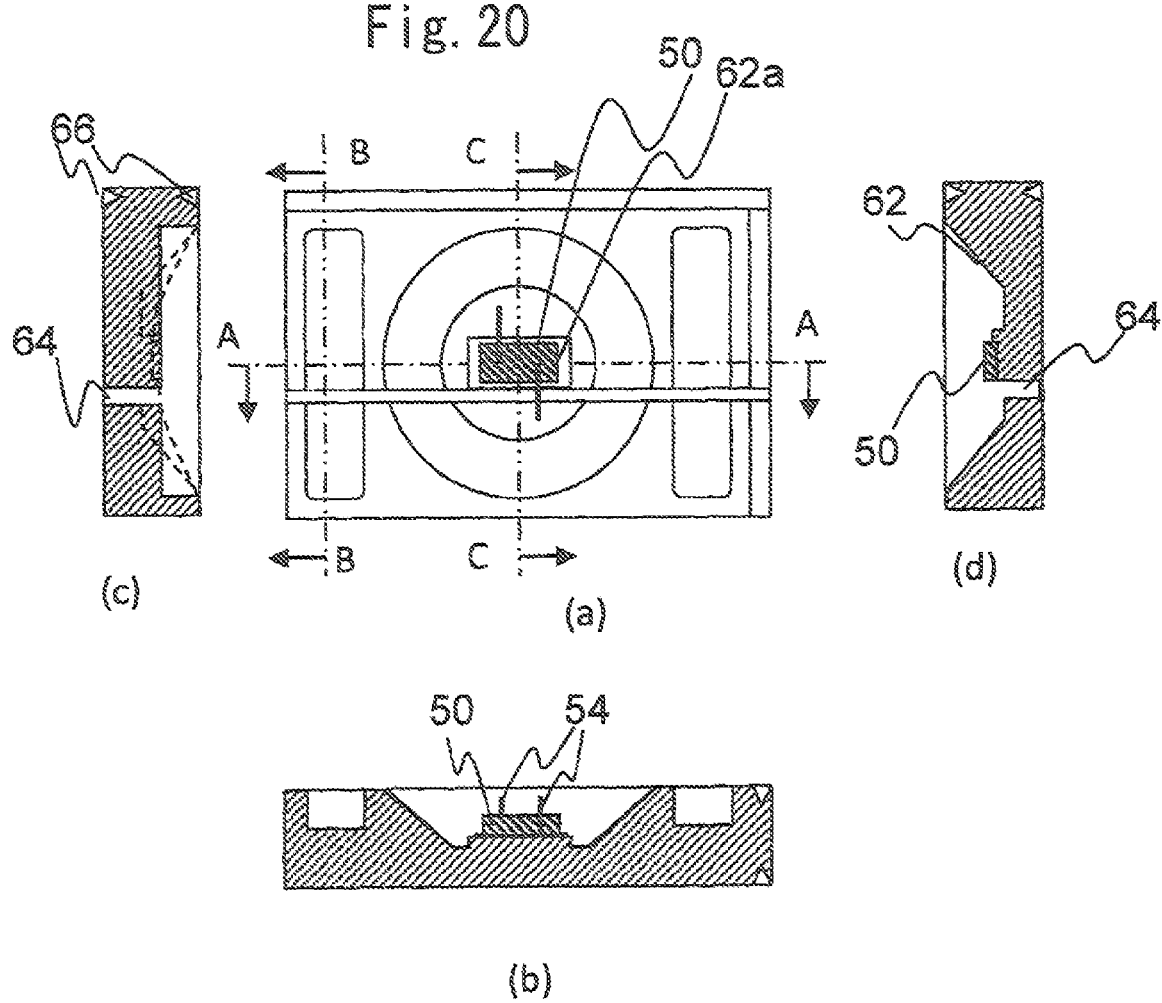
[FIG. 20] Drawings showing the metal substrate of FIG. 10 mounting LED elements: (a) top view, (b) sectional view along A-A in (a), (c) sectional view along B-B in (a), and (d) sectional view along C-C in (a)

Then, in the light emitting element mounting step (S702), LED elements are mounted on the upper surfaces of the convex portions 62a in the reflector parts 62. FIGS. 20, (a) to (d) show a state that the LED element 50 is mounted. In the example shown in the drawings, a face up double wire element of which back face consists of a sapphire substrate is used as the LED element 50. In the case of such an LED element 50, it is adhered on the upper surface of the convex portion 62a with a die attaching agent such as a white silicone adhesive, and then the cathode and anode of the LED element are connected to both sides of the metal substrate separated by the slit 64 with an Au wire 54 or the like, respectively, to electrically connect the LED elements. In the case of an LED element in which the anode and cathode are formed on different surfaces, a method of adhering the surface on which one of the electrodes is formed with a conductive silicone adhesive containing a filler such as silver, a method of partially plating the mounting surface with Au, and adhering the LED element by solder eutectic bonding, or the like is used to also realize electric connection to the metal substrate, and the electrode on the surface is connected to a metal portion divided by the slit with an Au wire or the like.

Figure 21:
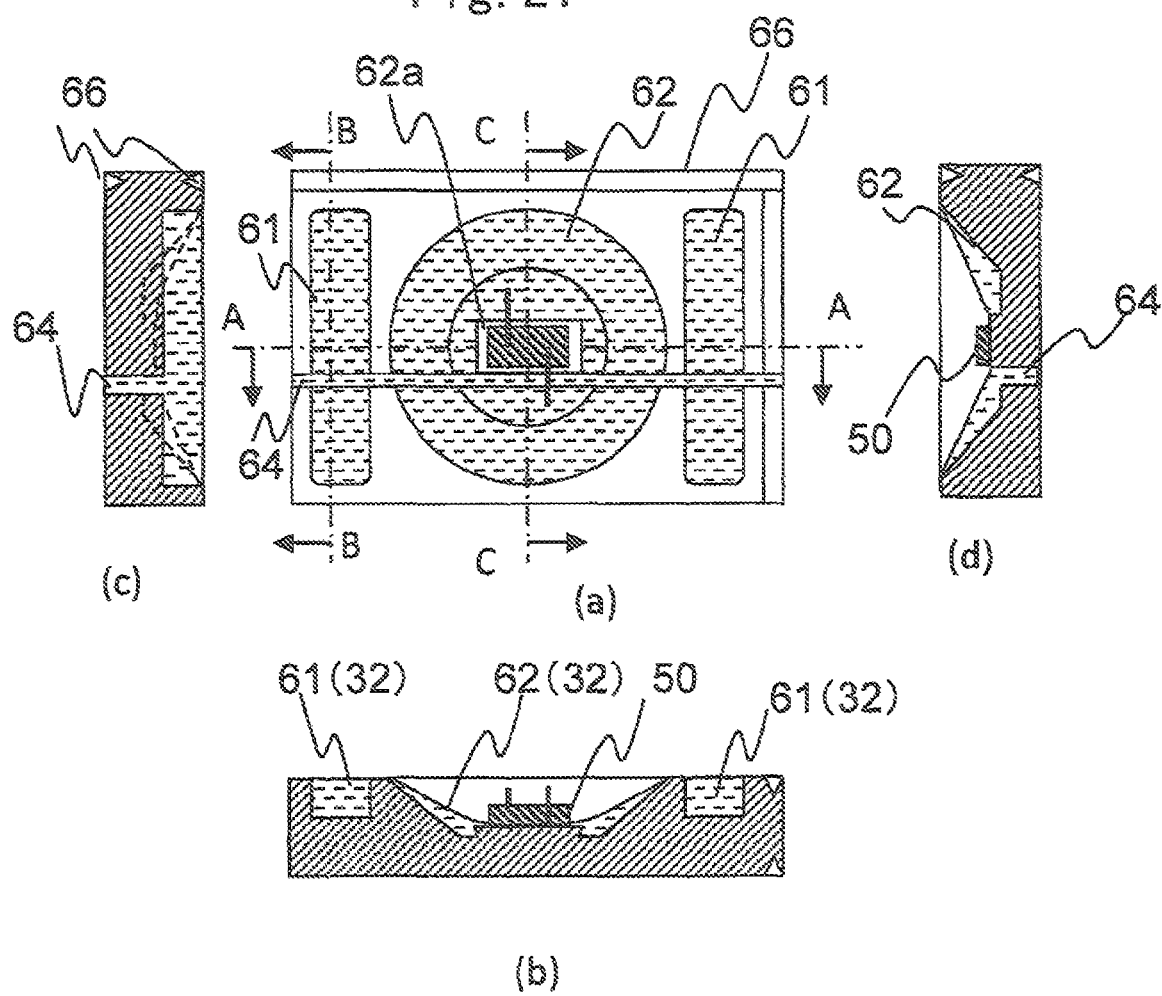
[FIG. 21] Drawings showing a metal substrate where LED elements are mounted, and then the recesses etc. are filled with a white resin: (a) top view, (b) sectional view along A-A in (a), (c) sectional view along B-B in (a), and (d) sectional view along C-C in (a)

In the resin filling step (S703), a white insulating resin (henceforth also referred to as white resin) is injected and filled into the recess 61, the slit 64, and the bottom portion of the reflector part 62 with a dispenser. FIG. 21 shows the state that the white resin 32 is filled in the recess 61, the slit 64, and the reflector part 62, wherein (a) is a top view, and (b) to (d) are a sectional view along the line A-A, a sectional view along the line B-B, and a sectional view along the line C-C thereof, respectively.

When the resin is injected into the bottom portion of the reflector part 62, the resin goes up on the internal wall of the reversed truncated cone with surface tension as shown in FIG. 21, (b). As a result, the bottom portion except for the convex portion 62a and the internal wall part are coated with the white resin. On the other hand, since the convex portion 62a has a height, the resin is prevented from going up to the upper surface of the convex portion 62a, and therefore decrease of luminous flux due to covering of the side of the element with the white resin can be prevented. When the bottom portion and the side wall portion of the reflector part 62 are covered by the white resin as described above, high reflectivity can be obtained, and since the layer of the white resin is provided up to a position higher than the height of the slit 64 in the reflector part 62, the adhesion strength of the metal substrate on the both sides of the slit 64 can be enhanced compared with a case where the resin is filled into only the slit 64. The injected resin is cured to complete this step.

Figure 22:
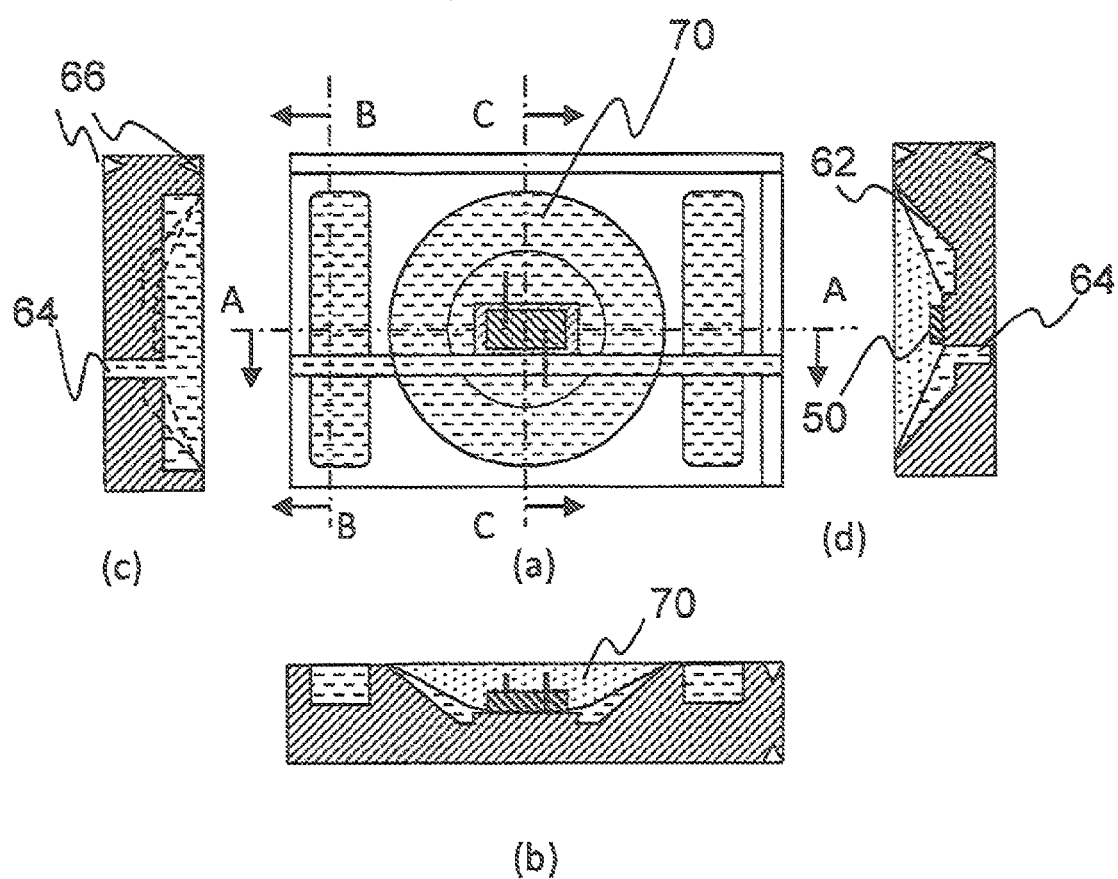
[FIG. 22] Drawings showing a metal substrate where the reflector parts are filled with a resin containing a fluorescent substance: (a) top view, (b) sectional view along A-A in (a), (c) sectional view along B-B in (a), and (d) sectional view along C-C in (a)

Then, the both peripheral portions of the metal substrate are separated, a power-on test is performed (step S704) to confirm that the LED elements have no defect, and then a resin containing a fluorescent substance is filled into the reflector parts 62 (step S705). As the filling method, potting, printing, and so forth can be employed, and the filling amount and thickness are controlled so that variation in color temperature should be decreased in any case. The state that the resin 70 containing a fluorescent substance is filled is shown in FIG. 22.

Then, the light emitting element parts are divided into units comprising one or a plurality of light emitting element parts (step S706), and the divided light emitting element parts are mounted on a printed circuit board (step S707), as in the case of the first embodiment. As shown in FIGS. 7, (a) to (c), the division scheme may be arbitrarily chosen, such as division for one element package, division for series connection, and division for parallel connection.

According to this embodiment, the convex portion for carrying light emitting element is formed at the bottom portion of the reflector part, and when the white resin is filled in the slit and the recess for serving as resin reservoir, the reflector part is also covered with the white resin for the bottom portion except for the convex portion for carrying light emitting element and the side portion, the reflectance can be improved compared with the case where the metal surface is used as reflection surface, and the light extraction efficiency can be improved. Specifically, although a reflectance of about 80% can be attained with Al, a reflectance of 90 to 95% can be attained with the white resin. Moreover, by forming the layer of the white resin at the bottom portion of the reflector part, the function of adhering the metal substrates divided by the slit (function of the white resin filled in the slit and the recess for serving as resin reservoir) can be further enhanced, and workability at the time of the production can be improved. This is because the white resin at the bottom portion of the reflector part closely adhered to divided portions of the metal substrate on both sides of the slit, and therefore this adhesion is added to adhesion obtained with the resin filled in the slit to increase the adhesion to the extent of the added adhesion. Moreover, by filling the resin into the slit and the white resin into the bottom portion of the reflector part at one time, any interface is not produced between the resins, and higher strength can be obtained. As a result, the width of the recess for serving as resin reservoir can be made smaller compared with that of the first or third embodiment, thus the interval of the adjacent reflector parts can be narrowed, and the whole light emitting device can be made smaller.

Moreover, this embodiment also provides an effect that the filling of the resin as reinforcement of the metal substrate and the formation of the reflection part of the reflector in the production steps can be performed in the same step.

<Eleventh Embodiment>

This embodiment relates to improvement of the insulating resin filling step in each of the embodiments mentioned above, more specifically improvement of the step of filling resin into the slit, and relates to a jig therefor. Therefore, the characteristic of this embodiment can be applied to all the first to tenth embodiments mentioned above.

Figure 23:
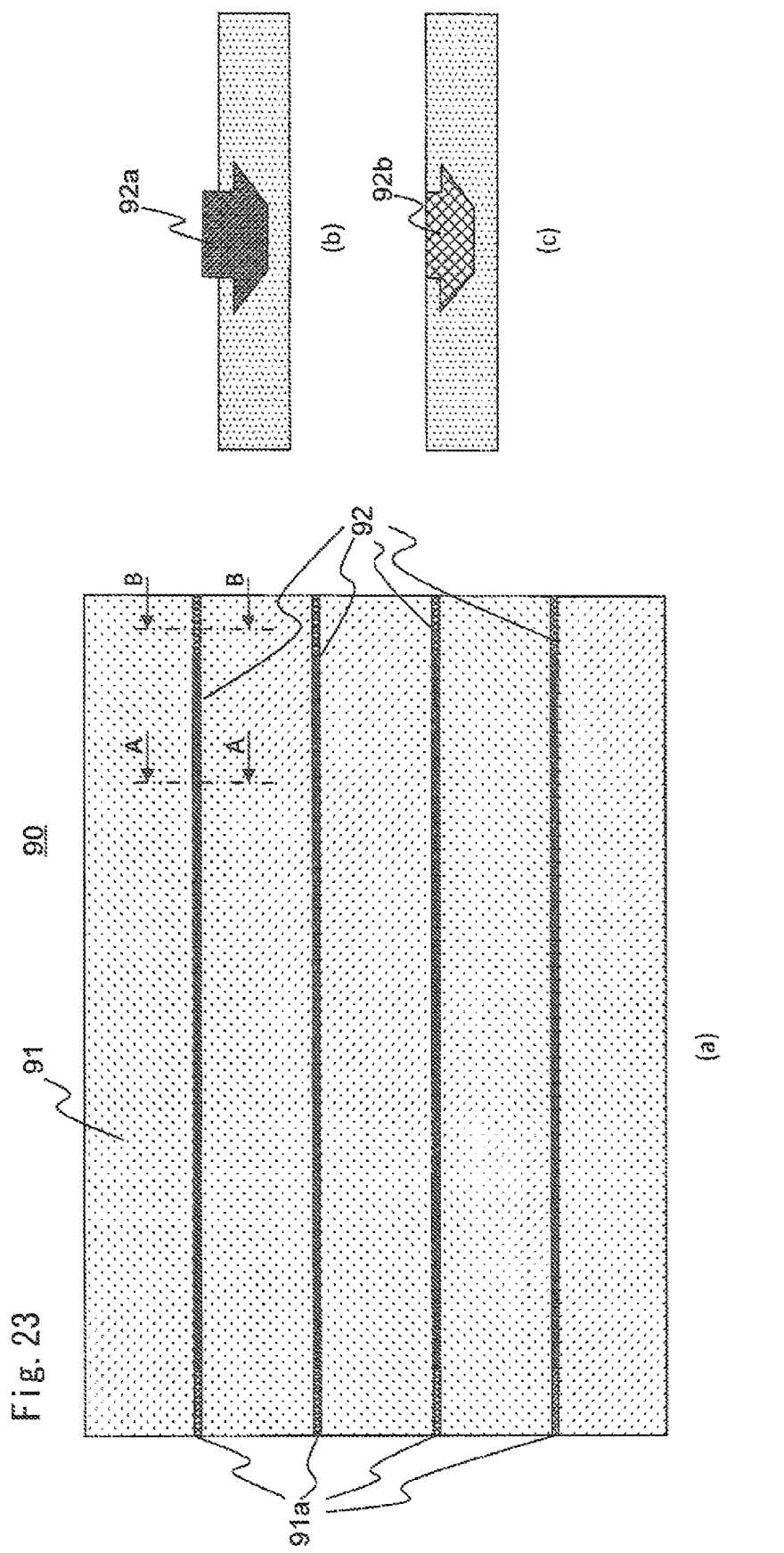
[FIG. 23] Drawings showing a jig used in the production method according to the eleventh embodiment: (a) top view, (b) and (c) enlarged sectional views along the line A-A and the line B-B in (a), respectively

A jig 90 used for the method for manufacturing a light emitting device according to this embodiment is shown in FIG. 23. FIG. 23, (a) is a top view, and (b) and (c) are a partial enlarged sectional views along the lines A-A and B-B in (a), respectively.

This jig 90 consists of a plate 91 for fixing the metal substrate and a convex member 92, which engages with a slot 91a of the plate 91. The convex member 92 consists of a material showing good mold release properties such as a fluorocarbon resin, and is removably attached to the plate 91. The plate 91 consists of a plate of metal or the like, and has a size larger than that of the metal substrate, and a mechanism for fixing the metal substrate 60 in a closely contacted state, for example, a structure for adsorbing the metal substrate or a structure for screw stopping the same. As a structure for adsorbing the metal substrate, for example, several holes for adsorption can be provided, and the holes can be connected to a suction pump or the like to fix the metal substrate placed on the plate 91 to the plate 91 in a closely adhered state. The slot 91a of the plate 91 is formed at the position corresponding to the slit of the metal substrate. In the example shown in the drawings, four of the slots 91a corresponding to the slits of the metal substrate shown in FIG. 18 are formed. However, the slots 91a are formed from one end to the other end of the plate 91, whereas the slits do not reach the ends of the metal substrate.

The slot 91a and the convex member 92 have approximately the same shape as shown in FIGS. 23, (b) and (c), but have such a structure that, in a state that the linear convex member 92 is engaged with the plate 91, the convex member 92 slightly protrudes from the surface of the plate 91 at the position specified as 92a at which the slit 64 exists, and surfaces of the convex member 92 and the plate 91 are flat (have no step) for the both end portions 92b corresponding to the end portions of the metal substrate at which the slit does not exist. By using this structure, when the metal substrate is closely contacted with the plate 91 attached with the convex member 92, a part of the convex member 92 enters into the slit 64, and in the portions other than the slit, including peripheral regions of the metal substrate, the metal substrate and the plate 91 can be closely contacted.

In the step of filling the resin into the slit (the step S102 in FIG. 1 and the step S703 in FIG. 17), the white resin is filled into the slit 24 or 64 in such a state that the metal substrate 20 or 60 is closely contacted with the jig 90 as described above. After the filling, the metal substrate is removed from the jig 90, and used for the following step. After the metal substrate is removed, the white resin adhering to the convex member 92 is wiped off as required, so that the jig 90 can be repeatedly used.

According to this embodiment, use of a lining tape, which has conventionally been indispensable for the filling of resin into the slit, can be made unnecessary to reduce the cost, and in addition, application of load to the metal substrate or the light emitting element part carried thereon at the time of removing the tape can be prevented. In such a process flow as shown in FIG. 17, where the LED element mounting step is performed before the resin filling step, in particular, application of load to wires for connecting the LED elements after the filling of the resin can be prevented, and thus decrease of the yield due to breaking of the wires can be prevented.

EXAMPLES

The following experiment was conducted in order to confirm the effect of the present invention.

An aluminum plate (thickness: 0.7 mm, 12.0 mm×10.0 mm) was prepared as a metal substrate, a slit was formed in a width of 0.7 mm at the center along the longer side direction, and a silicone resin (LPS-8433W-2, Shin-Etsu Chemical Co., Ltd.) was injected and cured. This was used as a sample of comparative example.

The same aluminum plate as that of the sample of the comparative example was prepared, a slit was formed in a width of 0.7 mm at the center of the plate along the longer side direction, recesses (width: 1.5 mm, length: 6.0 mm, depth: 0.3 mm) were formed at the both ends of the slit so as to be perpendicular to the slit, and the same silicone resin as that of the comparative example was injected into the slit and the recesses and cured. This was used as a sample of Example 1.

Separately, an aluminum plate (thickness: 0.7 mm, 12.0 mm×10.0 mm) was prepared as a metal substrate, a recess of a cylindrical shape (diameter: 4.0 mm, depth: 0.8 mm) having a convex portion (height: 0.4 mm, 1.0 mm×1.0 mm) at the center was formed at the center of the aluminum plate, and a slit having a width of 1.4 mm was formed along one end of the convex portion. Moreover, on the both sides of the aluminum plate, recesses (width: 1.5 mm, length: 6.0 mm, depth: 0.8 mm) were formed so as to perpendicularly intersect with the slit. The same silicone resin as that of the comparative example was injected into these cylindrical recess, slit and recesses at the both ends, and cured. This was used as a sample of Example 2.

Figure 24:
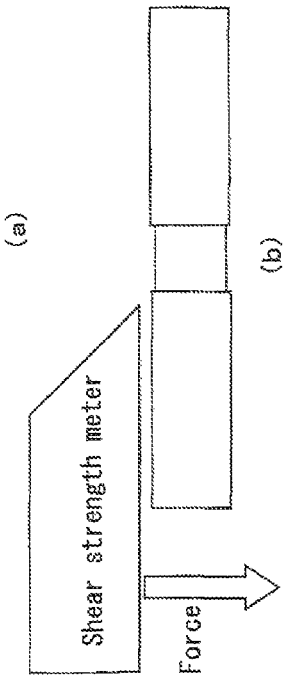
[FIG. 24] Drawings showing the evaluation method (b) and the results (a) of the examples

Five samples were prepared for each of the comparative example and Examples 1 and 2 mentioned above, and strength of the connection portions of the aluminum plates was measured for all the samples by using a shear strength meter (DAGE-SERIES-4000, DAGE) (FIG. 24, (b)). The measurement results are shown in FIG. 24, (a). In the table, "MIN" is a value of a sample showing the minimum strength among the five samples, "AVE" is average value, and "MAX" is a value of a sample showing the maximum strength among the five samples.

As seen from the results shown in the table, when resin reservoirs were provided at the both ends of the slit, the connection strength of the metal substrates connected with the resin in the slit was improved 3 to 4 times compared with the case where the resin reservoirs were not provided.

Moreover, when a cylindrical recess was provided at the center, the connection strength was further improved.

Industrial Applicability

According to the present invention, in a light emitting device produced by using a metal plate as a substrate, strength of connection portion of the metal substrate (portion of slit) is improved, and a light emitting device showing superior strength during the production and after the production can be obtained.

DESCRIPTION OF NOTATIONS 20, 60 . . . . Metal substrate, 21, 61 . . . recess for serving as resin reservoir, 21a, 21b . . . through-hole, 22, 62 . . . reflector part (region for forming light emitting element part), 22a, 22b . . . reflector part also serving as resin reservoir, 24, 64 . . . slit, 26, 66 . . . V-groove, 32 . . . resin, 50 . . . LED element, 52 . . . adhesive, 54. Au wire, 70 . . . sealing material (resin containing fluorescent substance), 80 . . . printed circuit board.

What is claimed is:

1. A method for manufacturing a light emitting device comprising the step (1) of forming a slit crossing a region for forming light emitting element part in a metal substrate, the step (2) of filling the slit with an insulating material, the step (3) of forming a light emitting element part in the region for forming light emitting element part, and the step (4) of cutting the metal substrate on which the light emitting element part is formed into units each comprising one or more of the light emitting element parts, wherein:

a recess for serving as resin reservoir is formed across the slit in a region of the metal substrate other than the region immediately under the region for forming light emitting element part in the step (1), and the recess is filled with a resin in the step (2), and in the step of filling the slit with an insulating material, a jig having the same or larger size compared with the size of the metal substrate, in which a convex member having mold release properties is formed at a position corresponding to the slit is closely contacted with the metal substrate so that the convex member should seal the bottom portion of the slit, and then the slit is filled with an insulating material.

2. The method for manufacturing a light emitting device according to claim 1, wherein:

the step (1) comprises the step of forming a reflector part in the region for forming light emitting element part of the metal substrate.

3. The method for manufacturing a light emitting device according to claim 1, wherein:

the resin filled in the recesses is the same material as the insulating material filled in the slit.

4. The method for manufacturing a light emitting device according to claim 1, wherein:

if the face of the metal substrate on which the region for forming light emitting element part exists is defined as the surface, the recesses are formed on the surface side.

5. The method for manufacturing a light emitting device according to claim 1, wherein:

if the face of the metal substrate on which the region for forming light emitting element part exists is defined as the surface, the recess for serving as resin reservoir is formed on the back face side.

6. A method for manufacturing a light emitting device comprising the step (1) of forming a region for forming light emitting element part and a slit crossing the region for forming light emitting element part in a metal substrate, the step (2) of forming a light emitting element part in the region for forming light emitting element part, the step (3) of filling the slit with an insulating material, and the step (4) of cutting the metal substrate on which the light emitting element part is formed into units each comprising one or more of the light emitting element parts, wherein:

the region for forming light emitting element part formed in the step (1) has a recess for serving as reflector and a convex portion protruding from the bottom surface of the recess for serving as reflector, a recess for serving as resin reservoir is formed across the slit in a region of the metal substrate other than the region immediately under the region for forming light emitting element part with respect to the substrate thickness direction in the step (1), and a bottom portion of the recess for serving as reflector except for the convex portion, and the recess for serving as resin reservoir are filled with a resin in the step (3).

7. The method for manufacturing a light emitting device according to claim 6, wherein:

the step (3) comprises the step of, after the bottom portion of the recess for serving as reflector and the recess for serving as resin reservoir are filled with a resin, filling the recess for serving as reflector with a resin containing a wavelength conversion material.

8. The method for manufacturing a light emitting device according to claim 6, wherein:

a plurality of the reflector parts are formed, and a part of the reflector parts among a plurality of the reflector parts also serve as the recess for serving as resin reservoir.

9. The method for manufacturing a light emitting device according to claim 8, wherein:

a plurality of kinds of the reflector parts having different shapes are formed in the step (1), light emitting elements are connected to the same type of the reflector parts among them, and the other reflector parts are used as recesses for serving as resin reservoir.

* * * * *